United States Patent
Chen et al.

(10) Patent No.: US 11,696,521 B2
(45) Date of Patent: Jul. 4, 2023

(54) HIGH ELECTRON AFFINITY DIELECTRIC LAYER TO IMPROVE CYCLING

(71) Applicant: Taiwan Semiconductor Manufacturing Co., Ltd., Hsin-Chu (TW)

(72) Inventors: Chao-Yang Chen, Hsinchu (TW); Chun-Yang Tsai, Hsinchu (TW); Kuo-Ching Huang, Hsinchu (TW); Wen-Ting Chu, Kaohsiung (TW); Cheng-Jun Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 182 days.

(21) Appl. No.: 16/939,497

(22) Filed: Jul. 27, 2020

(65) Prior Publication Data

US 2021/0135105 A1    May 6, 2021

Related U.S. Application Data

(60) Provisional application No. 62/927,902, filed on Oct. 30, 2019.

(51) Int. Cl.
*H01L 45/00* (2006.01)
*H10N 70/00* (2023.01)
(Continued)

(52) U.S. Cl.
CPC ....... *H10N 70/883* (2023.02); *G11C 13/0007* (2013.01); *H10B 63/00* (2023.02); *H10N 70/021* (2023.02); *H10N 70/841* (2023.02)

(58) Field of Classification Search
CPC .............. H01L 45/1233; H01L 45/146; H01L 45/1608
See application file for complete search history.

(56) References Cited

U.S. PATENT DOCUMENTS

| 10,176,866 B1 | 1/2019 | Trinh et al. |
| 2007/0018219 A1 | 1/2007 | Lim et al. |

(Continued)

FOREIGN PATENT DOCUMENTS

| DE | 102007021761 A1 | 11/2008 |
| KR | 20170093281 A | 8/2017 |
| TW | I361494 B | 4/2012 |

OTHER PUBLICATIONS

English translation of Korean patent document 10-2017-0093281 to Hwang, Aug. 2022.*

(Continued)

*Primary Examiner* — Mark V Prenty
(74) *Attorney, Agent, or Firm* — Eschweiler & Potashnik, LLC

(57) ABSTRACT

Various embodiments of the present disclosure are directed towards a memory cell comprising a high electron affinity dielectric layer at a bottom electrode. The high electron affinity dielectric layer is one of multiple different dielectric layers vertically stacked between the bottom electrode and a top electrode overlying the bottom electrode. Further, the high electrode electron affinity dielectric layer has a highest electron affinity amongst the multiple different dielectric layers and is closest to the bottom electrode. The different dielectric layers are different in terms of material systems and/or material compositions. It has been appreciated that by arranging the high electron affinity dielectric layer closest to the bottom electrode, the likelihood of the memory cell becoming stuck during cycling is reduced at least when the memory cell is RRAM. Hence, the likelihood of a hard reset/failure bit is reduced.

20 Claims, 16 Drawing Sheets

(51) Int. Cl.
   *G11C 13/00*   (2006.01)
   *H10B 63/00*   (2023.01)

(56) References Cited

U.S. PATENT DOCUMENTS

| | | |
|---|---|---|
| 2009/0212351 A1 | 8/2009 | Chen |
| 2014/0367631 A1 | 12/2014 | Govoreanu |
| 2015/0249211 A1 | 9/2015 | Knobloch et al. |
| 2016/0218283 A1 | 7/2016 | Trinh et al. |
| 2018/0309054 A1 | 10/2018 | Majhi et al. |
| 2020/0203603 A1 | 6/2020 | Glassman et al. |
| 2021/0135105 A1* | 5/2021 | Chen ................ H01L 45/08 |

OTHER PUBLICATIONS

Tsai, Chun Yang. "The Investigation of Novel High-Scaled Equivalent—Si3N4—Thickness Charge-Trapping Flash and Metal-Insulator-Metal-Capacitor." National Chiao-Tung University. Published Oct. 2011.

Mahata et al. "Sio2 Layer Effect on Atomic Layer Deposition Al2O3-Based Resistive Switching Memory" Applied Physics Letters, published on May 7, 2019.

\* cited by examiner

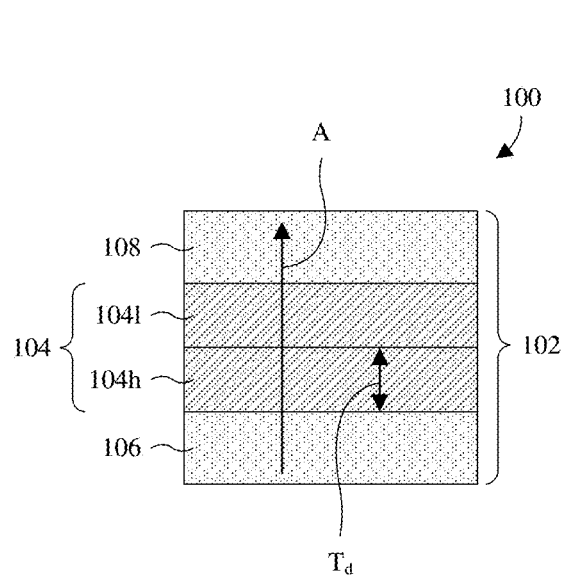

Fig. 1

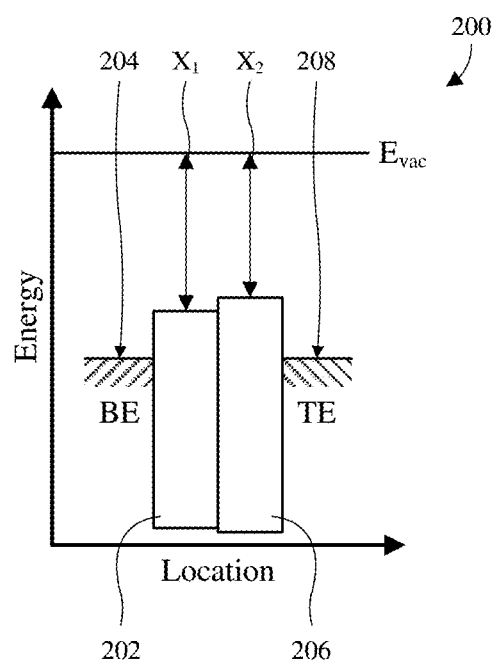

Fig. 2

| Material | Electron Affinity |
|---|---|
| Silicon oxide (e.g., $SiO_2$) | 0.55 eV |
| Silicon nitride (e.g., $Si_3N_4$) | 1.65 eV |
| Tantalum oxide (e.g., $Ta_2O_5$) | 3.75 eV |
| Barium titanium oxide (e.g., $BaTiO_3$) | 4.05 eV |
| Barium zircoinum oxide (e.g., $BaZrO_3$) | 3.25 eV |
| Zircoinum oxide (e.g., $ZrO_2$) | 2.65 eV |
| Hafnium oxide (e.g., $HfO_2$) | 2.55 eV |
| Lanthanum oxide (e.g., $La_2O_3$) | 1.75 eV |
| Aluminum oxide (e.g., $Al_2O_3$) | 1.25 eV |
| Yttrium oxide (e.g., $Y_2O_3$) | 2.75 eV |
| Zircoinum silicon oxide ($ZrSiO_4$) | 2.55 eV |
| Titanium oxide (e.g., $TiO_2$) | 2.85 eV |

Fig. 3

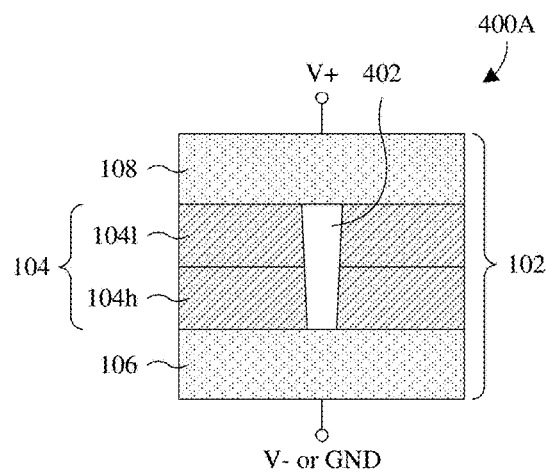
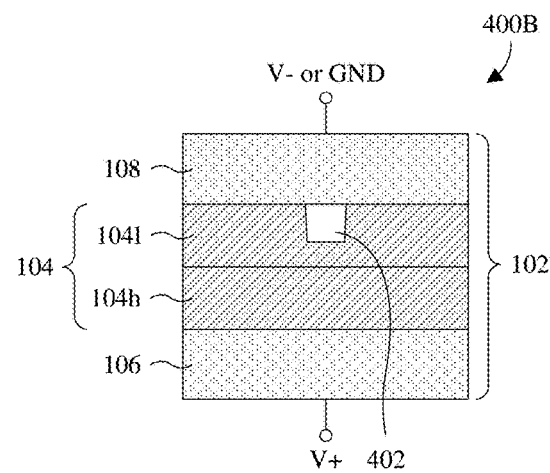
Fig. 4A             Fig. 4B
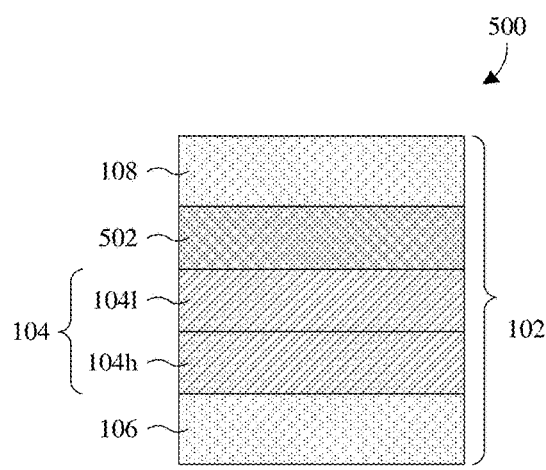
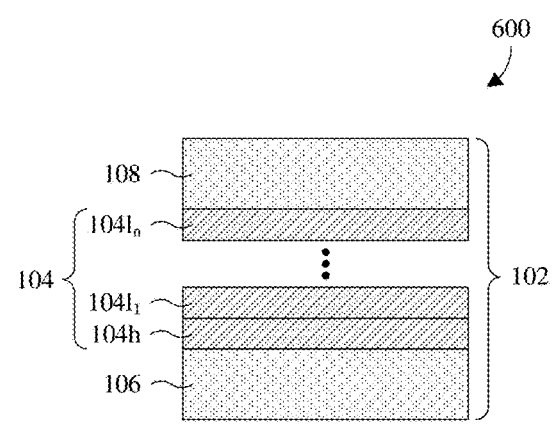
Fig. 5              Fig. 6

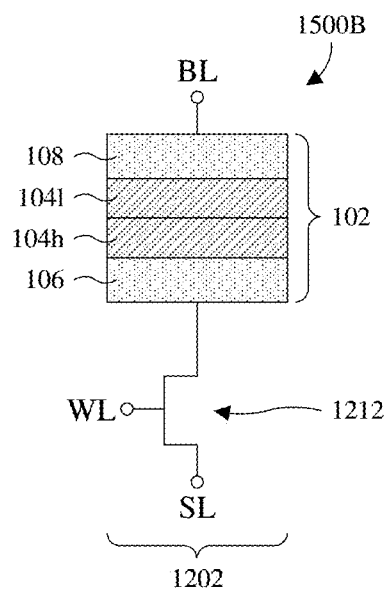 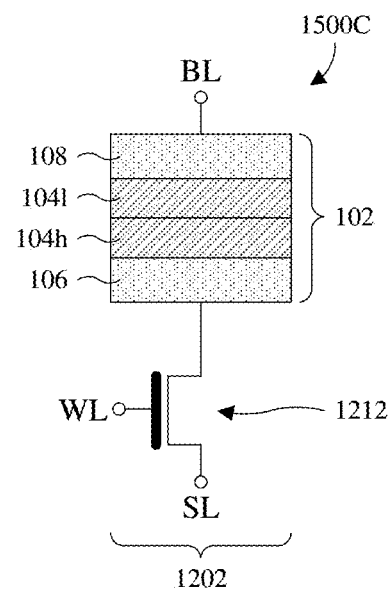
Fig. 15B     Fig. 15C
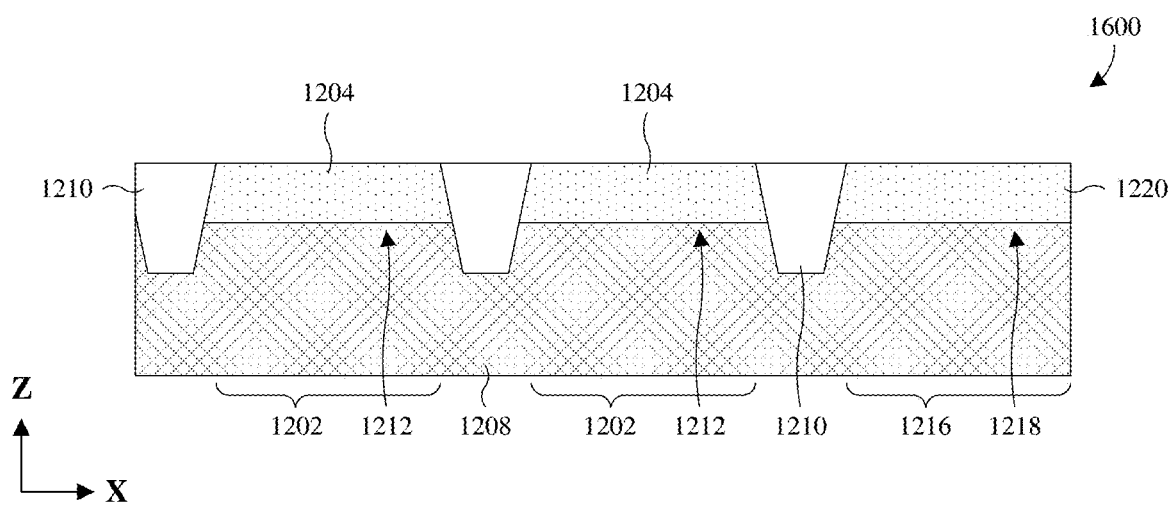
Fig. 16

# omit

HIGH ELECTRON AFFINITY DIELECTRIC LAYER TO IMPROVE CYCLING

REFERENCE TO RELATED APPLICATION

This application claims the benefit of U.S. Provisional Application No. 62/927,902, filed on Oct. 30, 2019, the contents of which are incorporated herein by reference in their entirety.

BACKGROUND

Many modern-day electronic devices include non-volatile memory. Non-volatile memory is electronic memory that is able to store data in the absence of power. Some promising candidates for the next generation of non-volatile memory include oxygen-ion type resistive random-access memory (RRAM) and metal-ion type RRAM. Both types of RRAM have relatively simple structures and are compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a cross-sectional view of some embodiments of a memory cell in which a high electron affinity (HEA) dielectric layer is at a bottom electrode.

FIG. 2 illustrates a graph of some embodiments of electron affinities for dielectric layers, including the HEA dielectric layer, in the memory cell of FIG. 1.

FIG. 3 illustrates a table listing electron affinities for various materials.

FIGS. 4A and 4B illustrate cross-sectional views of some embodiments of the memory cell of FIG. 1 respectively during a set operation and a reset operation.

FIG. 5 illustrates a cross-sectional view of some alternative embodiments of the memory cell of FIG. 1 in which the memory cell further includes a cap layer.

FIG. 6 illustrates a cross-sectional view of some alternative embodiments of the memory cell of FIG. 1 in which the memory cell comprises three or more dielectric layers.

FIGS. 15A-15C illustrate schematic diagrams of different alternative embodiments of the 1T1R cell of FIG. 14 in which access transistors are varied.

FIGS. 16-23 illustrate a series of cross-sectional views of some embodiments of a method for forming memory cells integrated with 1T1R cells and comprising individual HEA dielectric layers at corresponding bottom electrodes.

DETAILED DESCRIPTION

Figure 7:
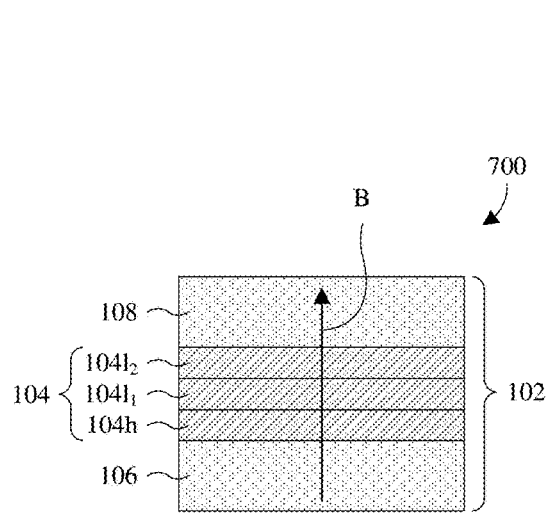
FIG. 7 illustrates a cross-sectional view of some embodiments of the memory cell of FIG. 6 in which the memory cell is limited to three dielectric layers.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some resistive random-access memory (RRAM) cells comprise a bottom electrode, a top electrode overlying the bottom electrode, and a single dielectric layer between the bottom and top electrodes. The single dielectric layer comprises a metal oxide and has a single material composition throughout. During a set operation, a set voltage with a positive polarity is applied from the top electrode to the bottom electrode to form a conductive filament in the single dielectric layer. The conductive filament electrically couples the bottom electrode to the top electrode, such that the RRAM cell is in a low resistance state (LRS). During a reset operation, a reset voltage with a negative polarity is applied from the top electrode to the bottom electrode to at least partially dissolve the conductive filament. As such, the RRAM cell is in a high resistance state (HRS). Because a resistance of the RRAM cell changes during the set and reset operations, the resistance may be employed to represent a bit of data. For example, the LRS may represent a binary "1", whereas the HRS may represent a binary "0", or vice versa.

A challenge with the RRAM cell is that the RRAM cell may become stuck at the LRS when cycling the RRAM cell. To the extent that this occurs, it typically occurs after many cycles of the RRAM cell. While the RRAM cell is stuck, the RRAM cell may be known as a hard reset bit. Further, read current through the RRAM cell may be greater than or about the same as that when the RRAM cell is in the LRS. The RRAM cell typically remains stuck for many cycles and may hence be considered a hard failure bit. As such, the RRAM cell may be subject to error correction code (ECC) correction by an ECC device when the RRAM cell is one of many like RRAM cells defining an RRAM array. However, ECC devices may be designed to correct random soft failure bits, not hard failure bits, and hence hard failure bits may use ECC capacity intended for random soft failure bits. To the extent that hard failure bits use too much ECC capacity, an ECC device may become overwhelmed and may be unable to correct random soft failure bits. This may, in turn, lead to failure of an RRAM array.

Various embodiments of the present disclosure are directed towards a memory cell comprising a high electron affinity (HEA) dielectric layer at a bottom electrode, as well as a method for forming the memory cell. The memory cell may, for example, be an RRAM cell or some other suitable type of memory cell. The HEA dielectric layer is one of multiple different dielectric layers vertically stacked between the bottom electrode and a top electrode overlying the bottom electrode. Further, the HEA dielectric layer has a highest electron affinity, and is closest to the bottom electrode, amongst the different dielectric layers. The different dielectric layers are different in terms of material systems and/or material compositions. Different material systems correspond to the different sets of elements, whereas different material compositions correspond to different ratios of elements for the same set of elements.

It has been appreciated that by arranging the HEA dielectric layer closest to the bottom electrode, the likelihood of the memory cell becoming stuck during cycling is reduced at least when the memory cell is RRAM. Hence, the likelihood of a hard reset/failure bit is reduced. Because the likelihood of a hard reset/failure bit is reduced, ECC capacity for a memory array to which the memory cell belongs is less likely to be used by hard reset/failure bits. Because ECC capacity is less likely to be used by hard reset/failure bits, ECC capacity for the memory array is less likely to be overwhelmed by hard reset/failure bits. Hence, the likelihood of the memory array failing is less likely. Because the likelihood of the memory array failing is reduced by the HEA dielectric layer, no additional ECC capacity is needed. This, in turn, conserves integrated circuit (IC) chip area that may otherwise be employed for additional ECC capacity.

As will be seen hereafter, the HEA dielectric layer may be integrated into memory process flows with an additional deposition. As such, the HEA dielectric layer adds little to no extra cost during the memory process flows. Further, the integration is compatible with 40 nanometer process nodes and smaller.

With reference to FIG. 1, a cross-sectional view 100 of some embodiments of a memory cell 102 is provided in which a HEA dielectric layer 104h is at a bottom electrode 106. The memory cell 102 may, for example, be an oxygen-ion type RRAM cell, a metal-ion type RRAM cell, or some other suitable type of memory cell. Note that metal-ion type RRAM cell may also be known as conductive bridging RAM (CBRAM).

The HEA dielectric layer 104h is one of multiple dielectric layers 104 that are vertically stacked over the bottom electrode 106 and that separate the bottom electrode 106 from a top electrode 108 overlying the bottom electrode 106. Further, the HEA dielectric layer 104h has a highest electron affinity, and is closest to the bottom electrode 106, amongst the multiple dielectric layers 104. Hence, the HEA dielectric layer 104h has a "high" electron affinity relative to a remainder of the multiple dielectric layers 104.

Electron affinity for a dielectric layer is an energy difference between a bottom conductive band edge of the dielectric layer and the vacuum level. The vacuum level is the same for the multiple dielectric layers 104 and may, for example, be about 4.05 electron volts (eV). Because the vacuum level is the same for the multiple dielectric layers 104, bottom conductive band edges of the multiple dielectric layers 104 respectively define electron affinities of the multiple dielectric layers 104. Further, the bottom conductive band edge of the HEA dielectric layer 104h is the lowest amongst the multiple dielectric layers 104.

It has been appreciated that by arranging the HEA dielectric layer 104h closest to the bottom electrode 106, the likelihood of the memory cell 102 becoming stuck during cycling is reduced at least when the memory cell 102 is RRAM. For example, the memory cell 102 may be most likely to become stuck during a reset operation when transitioning from a LRS to a HRS. Because the HEA dielectric layer 104h has the highest electron affinity amongst the multiple dielectric layers 104 and is at the bottom electrode 106, electrons may more easily pass through the multiple dielectric layers 104 during the reset operation. Hence, the likelihood of the memory cell 102 becoming stuck during cycling is reduced.

Because the likelihood of the memory cell 102 becoming stuck during cycling is reduced, the likelihood of a hard reset/failure bit is reduced. Because the likelihood of a hard reset/failure bit is reduced, ECC capacity for a memory array (not shown) incorporating the memory cell 102 is less likely to be used by hard reset/failure bits. Hence, the likelihood of the memory array failing is less likely. Because the likelihood of the memory array failing is reduced by the HEA dielectric layer 104h, no additional ECC capacity and therefore no additional IC chip area are needed.

With continued reference to FIG. 1, the multiple dielectric layers 104 are vertically stacked, and define a dielectric structure extending, from the bottom electrode 106 to the top electrode 108. Further, the multiple dielectric layers 104 have two dielectric layers: 1) the HEA dielectric layer 104h; and 2) a low electron affinity (LEA) dielectric layer 104l. The LEA dielectric layer 104l overlies and neighbors the HEA dielectric layer 104h and has a "low" electron affinity relative to the HEA dielectric layer 104h. In alternative embodiments, the multiple dielectric layers 104 have three or more different dielectric layers.

Each of the HEA and LEA dielectric layers 104h, 104l may, for example, be a metal oxide, a metal oxynitride, a component metal oxide, some other suitable dielectric(s), or any combination of the foregoing. Further, each of the HEA and LEA dielectric layers 104h, 104l may, for example, be titanium oxide (e.g., $TiO_2$), hafnium oxide (e.g., $HfO_2$), hafnium aluminum oxide (e.g., $Hf_xAl_{1-x}O_2$), tantalum oxide (e.g., $Ta_2O_5$), hafnium tantalum oxide (e.g., $Hf_xTa_{1-x}O_2$), tungsten oxide (e.g., $WO_2$), zirconium oxide (e.g., $ZrO_2$), aluminum oxide (e.g., $Al_2O_3$), sulfated tin oxide (e.g., STO), some other suitable dielectric(s), or any combination of the foregoing. In some embodiments, the HEA dielectric layer 104h is a high k dielectric and/or the LEA dielectric layer 104l is a high k dielectric. A high k dielectric may, for example, be a dielectric with a dielectric constant k greater than about 3.9, 10.0, or some other suitable value.

The HEA and LEA dielectric layers 104h, 104l have different material systems or different material compositions. Different material systems correspond to different sets of elements. Different material compositions correspond to different ratios of elements for the same set of elements (e.g., the same material systems).

In embodiments in which the HEA and LEA dielectric layers 104h, 104l have different material systems, the HEA dielectric layer 104h consists of or consists essentially of a first set of elements and the LEA dielectric layer 104l consists of or consists essentially of a second set of elements that is different than the first set of elements. For example, the HEA dielectric layer 104h may be aluminum oxide (e.g., $Al_2O_3$) and the LEA dielectric layer 104l may be silicon oxide (e.g., $SiO_2$). Other suitable materials are, however, amenable.

In embodiments in which the HEA and LEA dielectric layers 104h, 104l have different material compositions, the HEA dielectric layer 104h consists of or consists essentially of a set of elements. Further, the LEA dielectric layer 104l consists of or consists essentially of the set of elements but has a different ratio of the elements compared to the HEA dielectric layer 104h. For example, the HEA dielectric layer 104h may be aluminum oxide (e.g., $Al_2O_3$) and the LEA dielectric layer 104l may be aluminum oxide with a different ratio of aluminum and oxide (e.g., $Al_xO_y$, where $x \neq 2$ and $y \neq 3$). Other suitable materials are, however, amenable.

The HEA and LEA dielectric layers 104h, 104l have individual thicknesses $T_d$. In some embodiments, the thicknesses $T_d$ are about 1-50 nanometers, about 1-25 nanometers, about 25-50 nanometers, or some other suitable value. If the thickness $T_d$ of the HEA or LEA dielectric layer 104h, 104l is too small (e.g., less than about 1 nanometer or some other suitable value), benefits from material properties of the dielectric layer may not be attained. For example, if the thickness $T_d$ of the HEA dielectric layer 104h is too small, the HEA dielectric layer 104h may not reduce the likelihood of the memory cell 102 becoming stuck. If the thickness $T_d$ of the HEA or LEA dielectric layer 104h, 104l is too large (e.g., more than about 50 nanometers or some other suitable value), operating voltages of the memory cell 102 may be too high. The high voltages may, for example, increase power consumption, reduce the lifespan of the memory cell 102, and increase the risk of device failure.

The top and bottom electrodes 106, 108 are conductive and border the multiple dielectric layers 104. The bottom electrode 106 may, for example, be or comprise a metal, a metal nitride, a metal oxide, doped polysilicon, some other suitable conductive material(s), or any combination of the foregoing. The top electrode 108 may, for example, be or comprise a metal, a metal nitride, doped polysilicon, some other suitable conductive material(s), or any combination of the foregoing. The top and bottom electrodes 106, 108 may, for example, each be or comprise aluminum (e.g., Al), titanium (e.g., Ti), tantalum (e.g., Ta), gold (e.g., Au), platinum (e.g., Pt), tungsten (e.g., W), nickel (e.g., Ni), iridium (e.g., Ir), titanium nitride (e.g., TiN), tantalum nitride (e.g., TaN), N-doped polysilicon, P-doped polysilicon, some other suitable conductive material(s), or any combination of the foregoing.

With reference to FIG. 2, a graph 200 of some embodiments of electron affinities for the HEA and LEA dielectric layers 104h, 104l of FIG. 1 is provided. The vertical axis corresponds to energy and the horizontal axis corresponds to position along line A in FIG. 1. A first band gap 202 of the HEA dielectric layer 104h is spaced from a vacuum energy level $E_{vac}$ by a first electron affinity $X_1$ and borders a first fermi level 204 of the bottom electrode 106. A second band gap 206 of the LEA dielectric layer 104l is spaced from the vacuum energy level $E_{vac}$ by a second electron affinity $X_2$ less than the first electron affinity $X_1$. Further, the second band gap 206 borders a second fermi level 208 of the top electrode 108. The first and second fermi levels 204, 208 are the same, but may alternatively be different.

Note that a top edge of the first band gap 202 corresponds to a bottom conductive band edge of the HEA dielectric layer 104h, whereas a top edge of the second band gap 206 corresponds to a bottom conductive band edge of the LEA dielectric layer 104l. Hence, the bottom conductive band edge of the HEA dielectric layer 104h is lower than the bottom conductive band edge of the LEA dielectric layer 104l.

As described above, it has been appreciated that arranging the HEA dielectric layer 104h closest to the bottom electrode 106 reduces the likelihood of the memory cell 102 becoming stuck during cycling at least when the memory cell is RRAM. Hence, the likelihood of a hard reset/failure bit is reduced. Because the likelihood of a hard reset/failure bit is reduced, ECC capacity for a memory array (not shown) incorporating the memory cell 102 is less likely to be used by hard reset/failure bits. Hence, the likelihood of the memory array failing is less likely.

To determine the first and second electron affinities $X_1$, $X_2$ respectively of the HEA and LEA dielectric layers 104h, 104l, the first and second electron affinities $X_1$, $X_2$ may be measured by x-ray photoelectron spectroscopy (XPS) or by other suitable methods. Alternatively, materials of the HEA and LEA dielectric layers 104h, 104l may be looked up in the table of FIG. 3, which lists materials and corresponding electron affinities. For example, supposing the HEA dielectric layer 104h is $Al_2O_3$ and the LEA dielectric layer 104l is $SiO_2$, it can be seen through reference to the table of FIG. 3 that the first and second electron affinities $X_1$, $X_2$ are respectively about 1.25 eV and about 0.55 eV.

If a material of the HEA or LEA dielectric layer 104h, 104l is not found in the table of FIG. 3, but is a mixture of two or more materials found in the table of FIG. 3, an electron affinity of the material may be calculated from electron affinities of the two or more materials. Particularly, the electron affinity of the material may be calculated as a weighted summation of the electron affinities of the two or more materials using atomic percentages of the two or more materials as weights respectively for the electron affinities. For example, suppose the HEA or LEA dielectric layer 104h, 104l is $ZrTiO_4$. $ZrTiO_4$ is not found in the table of FIG. 3 but is a mixture of $TiO_2$ and $ZrO_2$. $TiO_2$ and $ZrO_2$ each have an atomic percentage of about 50 in $ZrTiO_4$. Further, as seen through reference to the table of FIG. 3, electron affinities for $ZrO_2$ and $TiO_2$ are respectively about 2.65 eV and 2.85 eV. Therefore, an electron affinity of $ZrTiO_4$ is about equal to 2.65 eV*0.5+2.85 eV*0.5, which is about equal to 2.75 eV. Notwithstanding that the determination of electron affinity was illustrated using $ZrTiO_4$, other suitable materials are amenable.

With reference to FIGS. 4A and 4B, cross-sectional views 400A, 400B of some embodiments of the memory cell 102 of FIG. 1 respectively during a set operation and a reset operation are provided. At FIG. 4A, a set voltage (e.g., V+ to V− or to GND) with a positive polarity is applied from the top electrode 108 to the bottom electrode 106 to form a conductive filament 402 in the multiple dielectric layers 104. The conductive filament 402 electrically couples the top electrode 108 to the bottom electrode 106 so the memory cell 102 is in a LRS. At FIG. 4B, a reset voltage (e.g., V− to V+ or GND to V+) with a negative polarity is applied from the top electrode 108 to the bottom electrode 106 to at least partially dissolve the conductive filament 402. Because the conductive filament 402 is at least partially dissolved, the memory cell 102 is in a HRS. Because a resistance of the memory cell 102 changes during the set and reset operations, the resistance may be employed to represent a bit of data. For example, the LRS may represent a binary "1", whereas the HRS may represent a binary "0", or vice versa.

In some embodiments, the memory cell 102 is an oxygen-ion type RRAM cell. During the set operation for at least some embodiments of the oxygen-ion type RRAM cell, oxygen ions move from the multiple dielectric layers 104 to a reservoir region (not shown) between the multiple dielectric layers 104 and the top electrode 108. Movement of the oxygen ions leaves oxygen vacancies making up the conductive filament 402 in the multiple dielectric layers 104. During the reset operation for at least some embodiments of the oxygen-ion type RRAM cell, oxygen ions move from the reservoir region to the multiple dielectric layers 104 to fill the oxygen vacancies and to break the conductive filament 402.

In some embodiments, the memory cell 102 is a metal-ion type RRAM cell. During the set operation for at least some embodiments of the metal-ion type RRAM cell, the top electrode 108 oxidizes to form metal ions. Further, the metal ions migrate to the multiple dielectric layers 104 and reduce into the conductive filament 402. During the reset operation for at least some embodiments of the metal-ion type RRAM cell, the conductive filament 402 oxidizes to form metal ions. Further, the metal ions migrate to the top electrode 108 and reduce into the top electrode 108. This, in turn, breaks the conductive filament 402. In some embodiments in which the memory cell 102 is the metal-ion type RRAM cell, the conductive filament 402 is flipped vertically in FIGS. 4A and 4B and extends upward from the bottom electrode 106 in FIGS. 4A and 4B.

With reference to FIG. 5, a cross-sectional view 500 of some alternative embodiments of the memory cell 102 of FIG. 1 is provided in which the memory cell 102 further comprises a cap layer 502. The cap layer 502 is between the top electrode 108 and the multiple dielectric layers 104 and has a high affinity for oxygen compared to the bottom and top electrodes 106, 108. In other words, the cap layer 502 depends upon less energy to react with oxygen than the bottom and top electrodes 106, 108.

In at least some embodiments in which the memory cell 102 is an oxygen-ion type RRAM cell, the reservoir region (not shown) is between the multiple dielectric layers 104 and the cap layer 502. Further, because the cap layer 502 has the high affinity for oxygen, the cap layer 502 increases the size of the reservoir region. As such, more oxygen ions may be stored while the memory cell 102 is set and hence in the LRS. Because more oxygen ions may be stored, the conductive filament 402 (see, e.g., FIGS. 4A and 4B) may have a larger density of oxygen vacancies and hence the LRS may have a lower resistance. This, in turn, may increase the difference between the resistances of the memory cell 102 respectively in the LRS and the HRS and may hence increases the switching window.

In at least some embodiments in which the memory cell 102 is a metal-ion type RRAM cell, the cap layer 502 oxidizes instead of the top electrode 108 during the set operation. Further, because the cap layer 502 has the high affinity for oxygen relative to the top electrode 108, the cap layer 502 more readily oxidizes than the top electrode 108. As such, the set operation may use a smaller set voltage, which may improve power efficiency and/or may increase the lifespan of the memory cell 102. Further, the density of metal ions may be higher and hence the density of metal in the conductive filament 402 may be higher. This, in turn, may increase the difference between the resistances of the memory cell 102 respectively in the LRS and the HRS and may hence increase the switching window.

The cap layer 502 may, for example, be or comprise aluminum, titanium, tantalum, hafnium, titanium oxide, hafnium oxide, zirconium oxide, germanium oxide, cerium oxide, some other suitable material(s), or any combination of the foregoing. In some embodiments, the cap layer 502 is conductive and/or is metal. For example, in embodiments in which the memory cell 102 is a metal-ion type RRAM cell, the cap layer 502 is conductive and comprises metal. In alternative embodiments, the cap layer 502 is dielectric. In embodiments in which the cap layer 502 is dielectric, the cap layer 502 has a lower electron affinity and a higher bottom conductive band edge than the HEA dielectric layer 104$h$.

With reference to FIG. 6, a cross-sectional view 600 of some alternative embodiments of the memory cell 102 of FIG. 1 is provided in which the multiple dielectric layers 104 include three or more dielectric layers: 1) the HEA dielectric layer 104$h$; and 2) two or more LEA dielectric layers (labeled 104$l_1$ to 104$l_n$, where n is an integer greater than 1).

Each of the two or more LEA dielectric layers 104$l_1$, ..., 104$l_n$ is as the LEA dielectric layer 104$l$ of FIG. 1 is described. Hence, each of the two or more LEA dielectric layers 104$l_1$, ..., 104$l_n$ has a lower electron affinity than the HEA dielectric layer 104$h$. Further, each of the two or more LEA dielectric layers 104$l_1$, ..., 104$l_n$ has a different material system or a different material composition than the HEA dielectric layer 104$h$. In some embodiments, each of the two or more LEA dielectric layers 104$l_1$, ..., 104$l_n$ is different than each neighboring LEA dielectric layer and/or each other LEA dielectric layer.

With reference to FIG. 7, a cross-sectional view 700 of some embodiments of the memory cell 102 of FIG. 6 is provided in which the memory cell 102 is limited to two LEA dielectric layers: a first LEA dielectric layer 104$l_1$; and a second LEA dielectric layer 104$l_2$. In other words, the integer n in FIG. 6 is equal to 2.

Figure 8A:
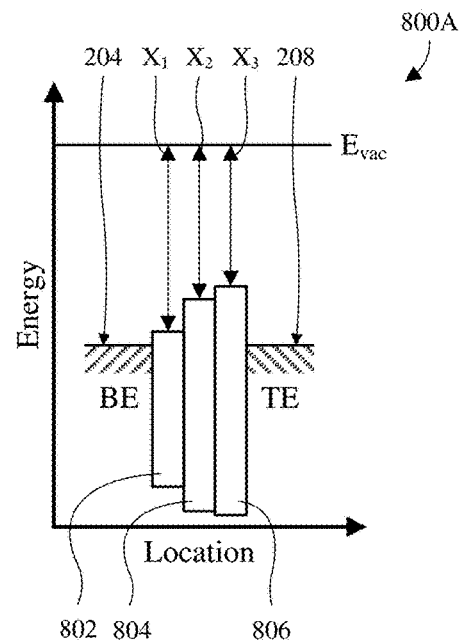
FIGS. 8A and 8B illustrate graphs of different embodiments of electron affinities for dielectric layers, including the HEA dielectric layer, in the memory cell of FIG. 7.
Figure 8B:
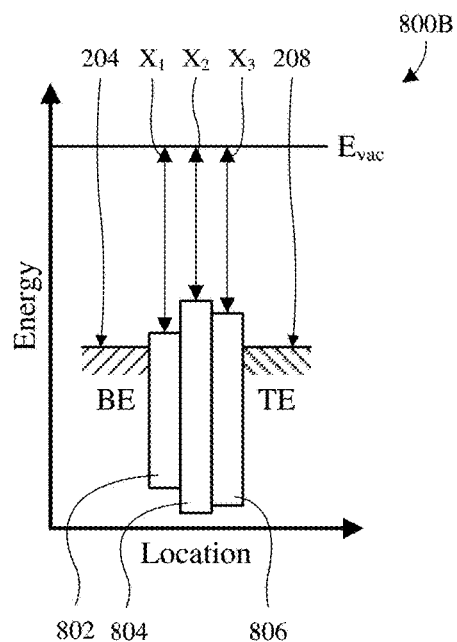

With reference to FIGS. 8A and 8B, graphs 800A and 800B of different embodiments of electron affinities for the HEA dielectric layer 104$h$ of FIG. 7 and the first and second LEA dielectric layers 104$l_1$, 104$l_2$ of FIG. 7 are provided. The vertical axis corresponds to energy and the horizontal axis corresponds to position along line B in FIG. 7.

A first band gap 802 of the HEA dielectric layer 104$h$ is spaced from a vacuum energy level $E_{vac}$ by a first electron affinity $X_1$ and borders a first fermi level 204 of the bottom electrode 106. A second band gap 804 of the first LEA dielectric layer 104$l_1$ is spaced from the vacuum energy level $E_{vac}$ by a second electron affinity $X_2$. A third band gap 806 of the second LEA dielectric layer 104$l_2$ is spaced from the vacuum energy level $E_{vac}$ by a third electron affinity $X_3$ and borders a second fermi level 208 of the top electrode 108. As explained above, the second and third electron affinities $X_2$, $X_3$ are less than the first electron affinity $X_1$ to prevent the memory cell 102 from becoming stuck during cycling at least when the memory cell is RRAM.

Note that a top edge of the first band gap 802 corresponds to a bottom conductive band edge of the HEA dielectric layer 104h, and top edges of the second and third band gaps 804, 806 correspond to bottom conductive band edges of the first and second LEA dielectric layers $104l_1$, $104l_2$. Hence, the bottom conductive band edge of the HEA dielectric layer 104h is lower than the bottom conductive band edges of the first and second LEA dielectric layers $104l_1$, $104l_2$.

With reference specifically to FIG. 8A, the first electron affinity $X_1$ is greater than the second electron affinity $X_2$, which is greater than the third electron affinity $X_3$. Hence, the electron affinity of a dielectric structure defined by the multiple dielectric layers 104 of FIG. 7 discretely decreases from the bottom electrode 106 to the top electrode 108. Further, the bottom conductive band edge of the dielectric structure has a stepped profile stepping upward from the bottom electrode 106 to the top electrode 108.

With reference specifically to FIG. 8B, the first electron affinity $X_1$ is greater than the second electron affinity $X_2$, and the third electron affinity $X_3$ is between the first and second electron affinities $X_1$, $X_2$. Hence, the electron affinity of the dielectric structure defined by the multiple dielectric layers 104 of FIG. 7 discretely decreases, and then discretely increases, from the bottom electrode 106 to the top electrode 108. Further, the bottom conductive band edge of the dielectric structure steps up, and then steps down, from the bottom electrode 106 to the top electrode 108. In alternative embodiments, the dielectric structure has other suitable electron affinity profiles and/or bottom conductive band edge profiles.

Figure 9:
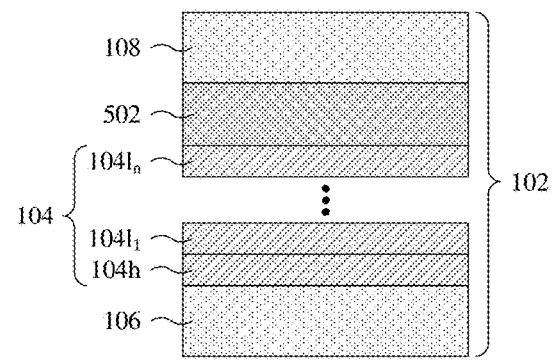
FIG. 9 illustrates a cross-sectional view of some alternative embodiments of the memory cell of FIG. 6 in which the memory cell further includes a cap layer.

With reference to FIG. 9, a cross-sectional view 900 of some alternative embodiments of the memory cell 102 of FIG. 6 is provided in which the memory cell 102 further comprises a cap layer 502. The cap layer 502 may, for example, be as described with regard to FIG. 5. Hence, the cap layer 502 may, for example, provide an enlarged switching window, reduced power consumption, other suitable benefits, or any combination of the foregoing.

Figure 10:
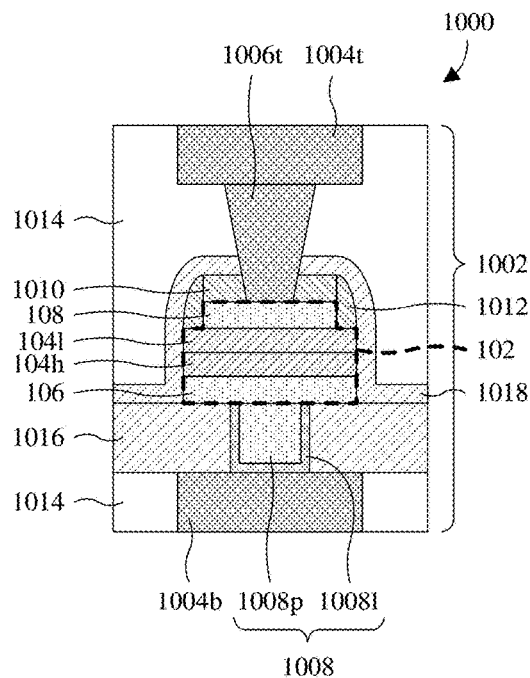
FIG. 10 illustrates a cross-sectional view of some embodiments of the memory cell of FIG. 1 in which the memory cell is integrated into an interconnect structure of an integrated circuit (IC) chip.

With reference to FIG. 10, a cross-sectional view 1000 of some embodiments of the memory cell 102 of FIG. 1 is provided in which the memory cell 102 is in an interconnect structure 1002 of an IC chip. The memory cell 102 underlies a top electrode wire 1004t and a top electrode via 1006t. Further, the memory cell 102 overlies a bottom electrode wire 1004b and a bottom electrode via 1008.

The top electrode via 1006t extends downward from the top electrode wire 1004t to the top electrode 108. Further, the top electrode via 1006t extends through a hard mask 1010 atop the top electrode 108. In alternative embodiments, the hard mask 1010 is omitted. The hard mask 1010 may be or comprise, for example, silicon nitride and/or some other suitable dielectric(s). The top electrode wire 1004t and the top electrode via 1006t may be or comprise, for example, copper, aluminum, aluminum copper, some other suitable metal(s), or any combination of the foregoing.

The bottom electrode via 1008 extends upward from the bottom electrode wire 1004b to the bottom electrode 106 and comprises a via plug 1008p and a via liner 1008l. In alternative embodiments, the via liner 1008l is omitted. The bottom electrode wire 1004b may be or comprise, for example, copper, aluminum, aluminum copper, some other suitable metal(s), or any combination of the foregoing.

The via liner 1008l cups an underside of the via plug 1008p to separate the via plug 1008p from the bottom electrode wire 1004b. In some embodiments, the via liner 1008l is an adhesion layer to enhance deposition of a layer from which the via plug 1008p is formed. In some embodiments, the via liner 1008l is a diffusion barrier to prevent material of the bottom electrode wire 1004b from diffusing upward to the via plug 1008p and/or the bottom electrode 106. The via liner 1008l may be or comprise, for example, tantalum nitride and/or some other suitable conductive barrier material(s). The via plug 1008p may be or comprise, for example, titanium nitride, aluminum, titanium, tantalum, gold, platinum, tungsten, some other suitable conductive material(s), or any combination of the foregoing. In some embodiments, the via plug 1008p is integrated with and/or is the same material as the bottom electrode 106, such that there is no boundary between the bottom electrode 106 and the via plug 1008p.

A dielectric structure surrounds the memory cell 102, as well as the top electrode wire 1004t, the top electrode via 1006t, the bottom electrode wire 1004b, and the bottom electrode via 1008. The dielectric structure comprises the hard mask 1010 and further comprises a sidewall spacer structure 1012 on sidewall(s) of the top electrode 108. The sidewall spacer structure 1012 may be or comprise, for example, silicon nitride and/or some other suitable dielectric(s). Additionally, the dielectric structure comprises a plurality of intermetal dielectric (IMD) layers 1014, a via dielectric layer 1016, an etch stop layer 1018.

The IMD layers 1014 respectively surround the bottom electrode wire 1004b and the top electrode wire 1004t. The IMD layers 1014 may be or comprise, for example, an extreme low k dielectric and/or some other suitable dielectric(s).

The via dielectric layer 1016 and the etch stop layer 1018 are stacked between the IMD layers 1014. The via dielectric layer 1016 surrounds the bottom electrode via 1008, between the memory cell 102 and the bottom electrode wire 1004b. The via dielectric layer 1016 may, for example, be or comprise silicon carbide, silicon-rich oxide, some other suitable dielectric(s), or any combination of the foregoing. The etch stop layer 1018 covers the via dielectric layer 1016 and wraps around a top of the memory cell 102. The etch stop layer 1018 may be or comprise, for example, silicon carbide and/or some other suitable dielectric(s).

Figure 11A:
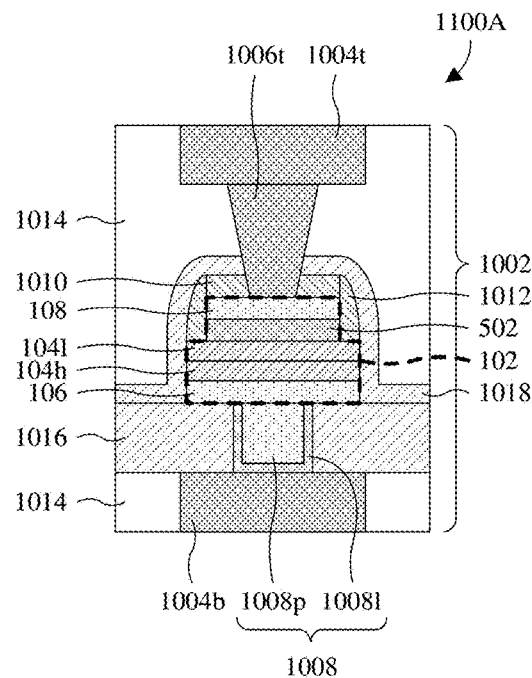
FIGS. 11A and 11B illustrate cross-sectional views of different alternative embodiments of the memory cell of FIG. 10.
Figure 11B:
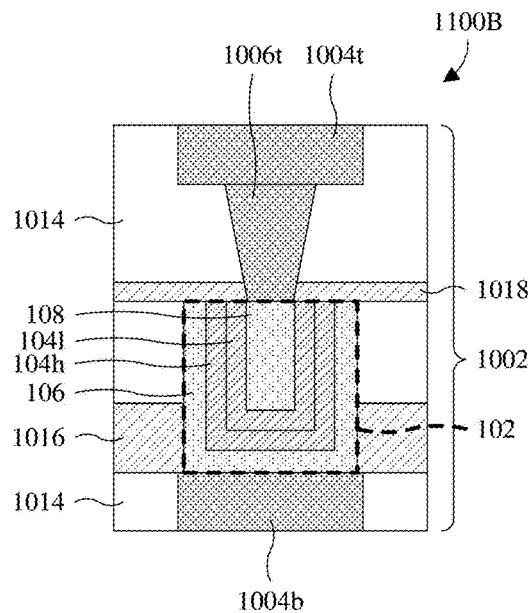

With reference to FIGS. 11A and 11B, cross-sectional views 1100A, 1100B of different alternative embodiments of the memory cell 102 of FIG. 10 are provided. In FIG. 11A, the memory cell 102 further comprises a cap layer 502 as described with regard to FIG. 5. Further, the sidewall spacer structure 1012 is on sidewalls of the cap layer 502. In FIG. 11B, the memory cell 102 is directly on the bottom electrode wire 1004b and each individual layer of the memory cell 102, except for the top electrode 108, has a U-shaped or V-shaped profile. Other suitable profiles are, however, amenable in alternative embodiments. Further, relative positioning between features has been rearranged and the bottom electrode via 1008, the sidewall spacer structure 1012, and the hard mask 1010 are omitted.

The memory cell 102 of FIG. 11B may be formed with a single photolithography/etching process. For example, the via dielectric layer 1016 and a bordering one of the IMD layers 1014 may be deposited over the bottom electrode wire 1004b. The via dielectric layer 1016 and the IMD layer may then be patterned to define a memory cell opening exposing the bottom electrode wire 1004b. Further, the individual layers from which the memory cell 102 is formed may be conformally deposited in the memory cell opening and covering the IMD layer. With the layers deposited, a planarization may be performed to uncover the IMD layer and to pattern the layers into the memory cell 102. Because photolithography is expensive, forming the memory cell 102 of FIG. 11B by a single photolithography/etching process may be a substantial cost savings.

Figure 12A:
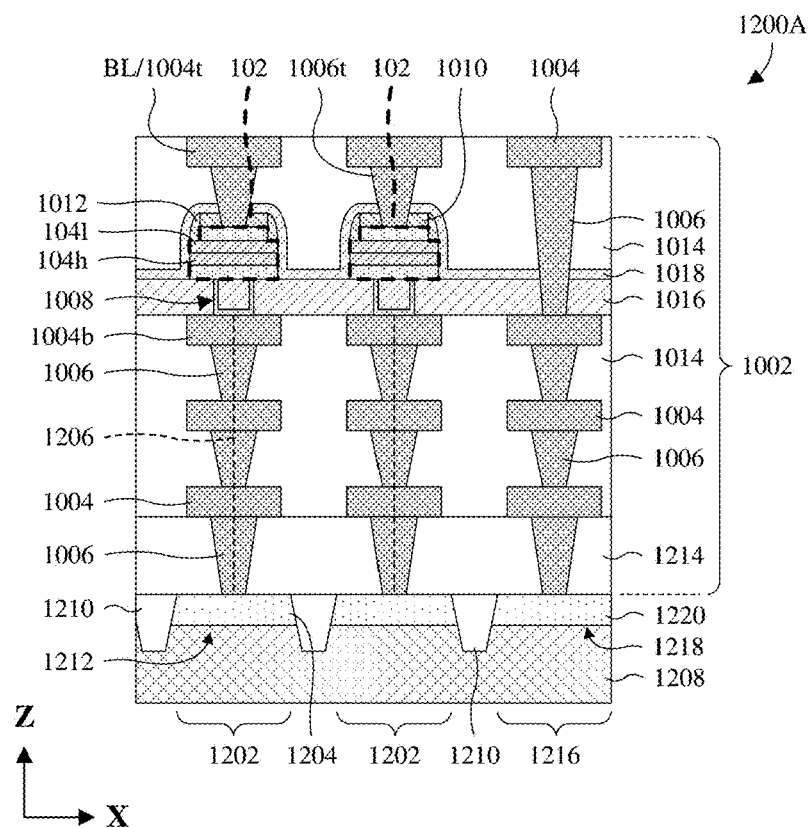
FIGS. 12A and 12B illustrate cross-sectional views of some embodiments of an IC chip comprising multiple memory cells integrated into individual one-transistor one-resistor (1T1R) cells and each configured as in FIG. 10.

With reference to FIG. 12A, a cross-sectional view 1200A of some embodiments of an IC chip comprising multiple memory cells 102 is provided in which the memory cells 102 are integrated into individual one-transistor one-resistor (1T1R) cells 1202 and are each configured as in FIG. 10. The 1T1R cells 1202 comprise individual drain regions 1204 and individual drain-side conductive paths 1206.

The drain regions 1204 are doped regions of a substrate 1208 and each has an opposite doping type as an adjoining region of the substrate 1208. Further, the drain regions 1204 are electrically separated from each other by a trench isolation structure 1210 and partially define access transistors 1212 (partially shown) used to individually select the memory cells 102. The trench isolation structure 1210 extends into a top of the substrate 1208 and comprises silicon oxide and/or some other suitable dielectric material(s). The trench isolation structure 1210 may, for example, be a shallow trench isolation (STI) structure or some other suitable trench isolation structure. The substrate 1208 may, for example, be a bulk silicon substrate, a silicon-on-insulator (SOI) substrate, or some other suitable semiconductor substrate.

The drain-side conductive paths 1206 electrically couple the drain regions 1204 to the memory cells 102 and are defined by the interconnect structure 1002. The interconnect structure 1002 comprises a plurality of wires 1004 and a plurality of vias 1006. The plurality of wires 1004 comprises the top electrode wires 1004*t* and the bottom electrode wires 1004*b*. In some embodiments, the top electrode wires 1004*t* correspond to bit lines BL. The plurality of vias 1006 comprises the top electrode via 1006*t*. A level of the vias 1006 nearest the substrate 1208 is in an interlayer dielectric (ILD) layer 1214, whereas remaining levels of the vias 1006 and the wires 1004 are in IMD layers 1014. The wires 1004 and the vias 1006 are conductive and may be or comprise, for example, copper, aluminum, aluminum copper, some other suitable conductive material(s), or any combination of the foregoing.

A peripheral region 1216 to a side of the 1T1R cells 1202 accommodates a peripheral device 1218 (only partially shown). The peripheral device 1218 comprises a pair of source/drain regions 1220 (only one of which is shown) in the substrate 1208, and further comprises a gate structure (not shown) between the source/drain regions 1220. The source/drain regions 1220 are doped regions of the substrate 1208 and each has an opposite doping type as an adjoining region of the substrate 1208. The peripheral device 1218 may, for example, be a metal-oxide-semiconductor field-effect transistor (MOSFET) or some other suitable type of semiconductor device. In alternative embodiments, the peripheral device 1218 is a fin field-effect transistor (FinFET), a gate-all-around field-effect transistor (GAA FET), a nanowire field-effect transistor, a nanosheet field-effect transistor, or some other suitable type of semiconductor device.

Figure 12B:
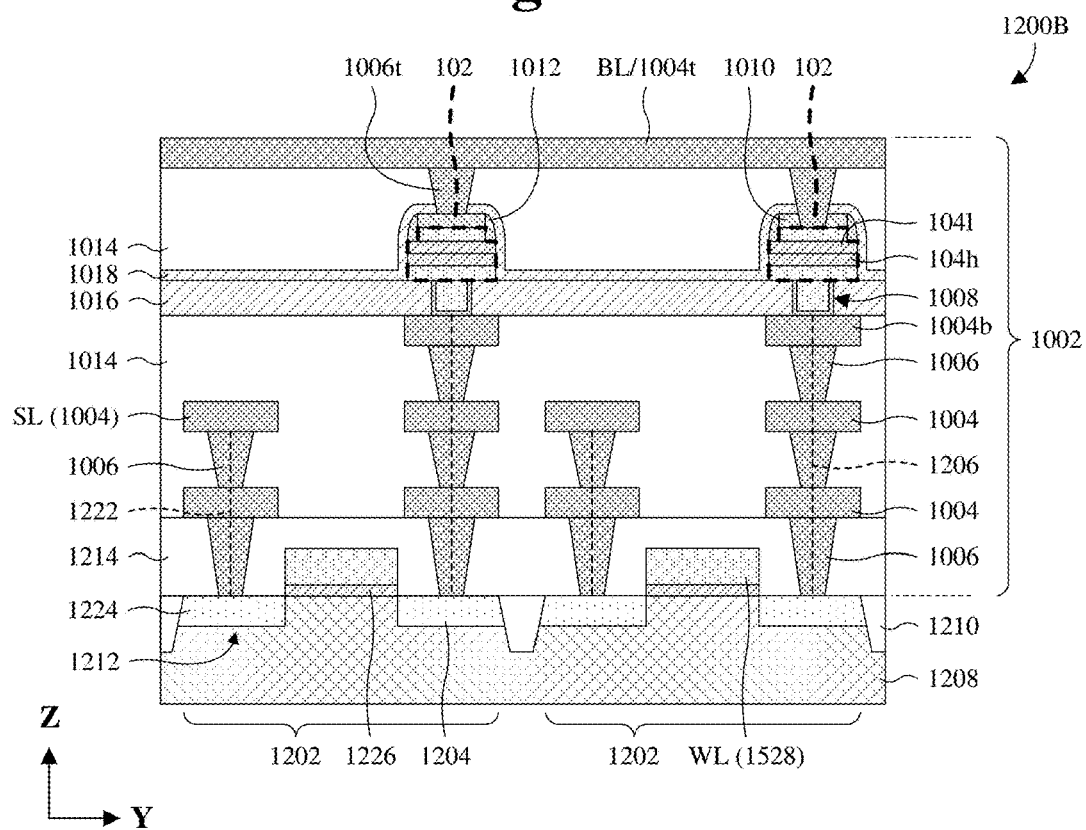

With reference to FIG. 12B, a cross-sectional view 1200B of some embodiments of the IC chip of FIG. 12A is provided along an axis orthogonal to an axis along which the cross-sectional view 1200A of FIG. 12A is taken. The 1T1R cells 1202 comprise individual memory cells 102, individual drain-side conductive paths 1206, individual access transistors 1212, and individual source-side conductive paths 1222.

The access transistors 1212 are on the substrate 1208, between the substrate 1208 and the interconnect structure 1002. Further, the access transistors 1212 are electrically separated from each other by the trench isolation structure 1210. The access transistors 1212 comprise individual drain regions 1204, individual source regions 1224, individual gate dielectric layers 1226, and individual gate electrodes 1228. The gate electrodes 1228 respectively overlie the gate dielectric layers 1226 and, in some embodiments, define word lines WL. The drain and source regions 1204, 1224 are doped regions of the substrate 1208 and each has an opposite doping type as an adjoining region (e.g., a bulk) of the substrate 1208. The drain regions 1204 respectively border drain sides of the gate electrodes 1228, and the source regions 1224 respectively border source sides of the gate electrodes 1228. The access transistors 1212 may, for example, be MOSFETs or some other suitable type of semiconductor devices.

The drain-side conductive paths 1206 electrically couple the drain regions 1204 to the memory cells 102, and the source-side conductive paths 1222 electrically couple the source regions 1224 to source lines SL. The drain-side and source-side conductive paths 1206, 1222 are defined by the plurality of wires 1004 and the plurality of vias 1006.

Figure 13:
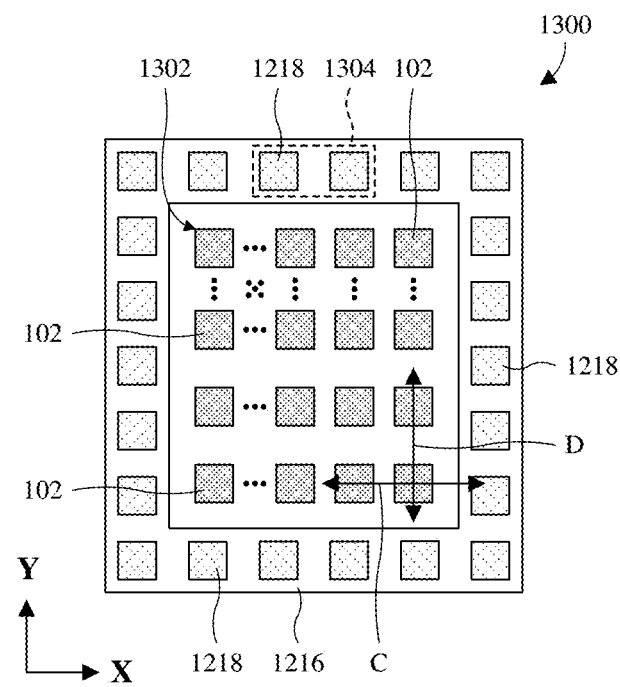
FIG. 13 illustrates a top layout of some embodiments of the IC chip of FIGS. 12A and 12B.

With reference to FIG. 13, a top layout 1300 of some embodiments of the IC chip of FIGS. 12A and 12B is provided. The cross-sectional views 1200A, 1200B of FIGS. 12A and 12B may, for example, respectively be taken along lines C and D or other suitable locations. The IC chip comprises a plurality of memory cells 102 in a plurality of rows and a plurality of columns, thereby defining a memory array 1302. The memory cells 102 may, for example, be as in any of FIG. 1, 4A, 4B, 5-7, 9, 10, 11A, 11B, 12A, or 12B.

Peripheral devices 1218 surround the memory array 1302 at a peripheral region 1216 of the IC chip. The peripheral devices 1218 may, for example, be or comprise transistors and/or other suitable semiconductor device(s). Further, the peripheral devices 1218 may, for example, implement ECC circuitry, read/write circuitry, other suitable circuitry for operating the memory cells 102, or any combination of the foregoing.

As described above, the memory cells 102 include individual HEA dielectric layers arranged closest to individual bottom electrodes to reduce the likelihood of the memory cells 102 becoming stuck during cycling at least when the memory cells 102 are RRAM cells. Hence, the likelihood of hard reset/failure bits is reduced. Because the likelihood of hard reset/failure bits is reduced, ECC capacity in ECC circuitry for the memory array 1302 is less likely to be used by hard reset/failure bits. In some embodiments, the ECC circuitry is wholly or partially defined by a portion 1304 of the peripheral region 1216. Because ECC capacity is less likely to be used by hard reset/failure bits, the likelihood of the memory array 1302 failing is less likely. Because the likelihood of the memory array 1302 failing is reduced by the HEA dielectric layers, no additional ECC capacity and therefore no additional IC chip area are needed.

Figure 14:
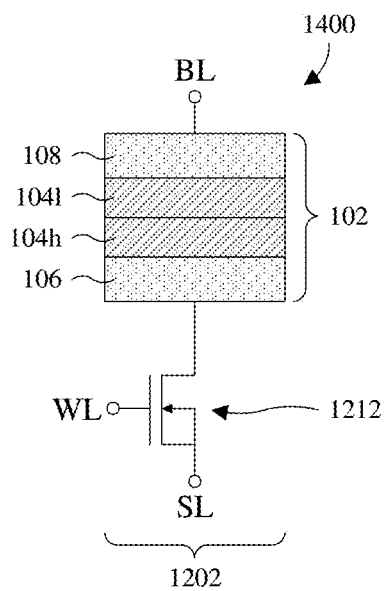
FIG. 14 illustrates a schematic diagram of some embodiments of a 1T1R cell in FIGS. 12A and 12B.

With reference to FIG. 14, a schematic diagram 1400 of some embodiments of a 1T1R cell 1202 in FIGS. 12A and 12B is provided. The 1T1R cell 1202 is representative of each other 1T1R cell 1202 in FIGS. 12A and 12B and includes a memory cell 102 and an access transistor 1212 that are electrically coupled in series from a bit line BL to a source line SL. As described above, the memory cell 102 includes a HEA dielectric layer 104*h* to prevent the memory cell 102 from becoming stuck during cycling at least when the memory cell 102 is RRAM. The access transistor 1212 is gated by a word line WL and selectively couples the memory cell 102 to the source line SL depending on a signal carried on the word line WL. The access transistor 1212 is illustrated as a MOSFET but may be some other suitable type of semiconductor device.

Figure 15A:
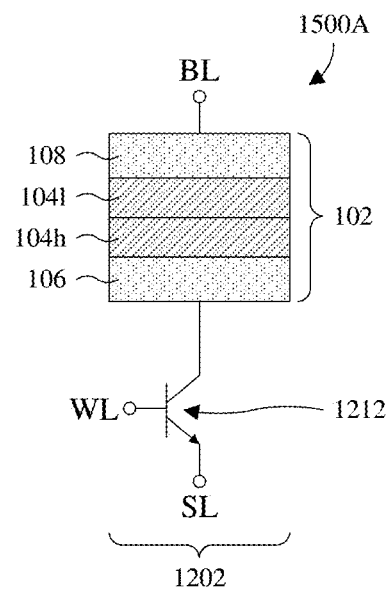

With reference to FIGS. 15A-15C, schematic diagrams 1500A-1500C of some different alternative embodiments of the 1T1R cell 1202 of FIG. 14 is provided in which the access transistor 1212 is a different type of semiconductor device. In FIG. 15A, the access transistor 1212 is a bipolar junction transistor (BJT). In FIG. 15B, the access transistor 1212 is a HEMT with a Schottky gate contact. In FIG. 15C, the access transistor 1212 is a metal-oxide-semiconductor (MOS) high-electron-mobility transistor (HEMT). In alternative embodiments, the access transistor 1212 is some other suitable type of semiconductor device.

While the memory cells 102 of FIGS. 10, 11A, 11B, 12A, 12B, 14, and 15A-15C are illustrated with a single LEA dielectric layer 104l, the memory cells 102 of FIGS. 10, 11A, 11B, 12A, 12B, 14, and 15A-15C may have two or more LEA dielectric in alternative embodiments. Examples are illustrated in FIGS. 5 and 6. While the memory cells 102 of FIGS. 11B, 12A, 12B, 14, and 15A-15C are illustrated without the cap layer 502 of FIG. 5, the memory cells 102 of FIGS. 11B, 12A, 12B, 14, and 15A-15C may have the cap layer 502 in alternative embodiments. While each memory cell 102 in the IC chip of FIGS. 12A and 12B is configured according to the embodiments of FIG. 10, the embodiments of FIGS. 11A and 11B may alternatively be employed. While the 1T1R cells 1202 of FIGS. 14 and 15A-15C comprise the memory cell 102 of FIG. 1, the 1T1R cells 1202 of FIGS. 14 and 15A-15C may instead comprise the memory cell 102 in any of FIG. 4A, 4B, 5-7, 9, 10, 11A, 11B, 12A, or 12B in alternative embodiments.

With reference to FIGS. 16-23, a series of cross-sectional views 1600-2300 of some embodiments of a method for forming memory cells integrated with 1T1R cells and comprising individual HEA dielectric layers at corresponding bottom electrodes is provided. The cross-sectional views 1600-2300 may, for example, be taken along line C in FIG. 13 or at some other suitable location in FIG. 13. Further, the cross-sectional views 1600-2300 may, for example, illustrate formation of the IC chip of FIGS. 12A and 12B with the addition of a cap layer.

As illustrated by the cross-sectional view 1600 of FIG. 16, a trench isolation structure 1210 is formed extending into a top of a substrate 1208. The trench isolation structure 1210 individually surrounds and demarcates regions of the substrate 1208 at which 1T1R cells 1202 are being formed. Further, the trench isolation structure 1210 surrounds and demarcates a peripheral region 1216 of the IC chip.

Also illustrated by the cross-sectional view 1600 of FIG. 16, a plurality of semiconductor devices is formed on the substrate 1208. The plurality of semiconductor devices comprises access transistors 1212 (only partially shown) individual to and respectively at the 1T1R cells 1202 being formed. Further, the plurality of semiconductor devices comprises a peripheral device 1218 (only partially shown) at the peripheral region 1216 of the IC chip. The access transistors 1212 comprise individual drain regions 1204 and individual source regions (not shown) in the substrate 1208. Further, the access transistors 1212 comprise individual gate structures (not shown). The gate structures have individual drain sides respectively bordering the drain regions 1204 and further have individual source sides respectively bordering the source regions. The peripheral device 1218 comprises a pair of source/drain regions 1220 (only one of which is shown) in the substrate 1208 and further comprises a gate structure (not shown) between and bordering the source/drain regions 1220.

Figure 17:
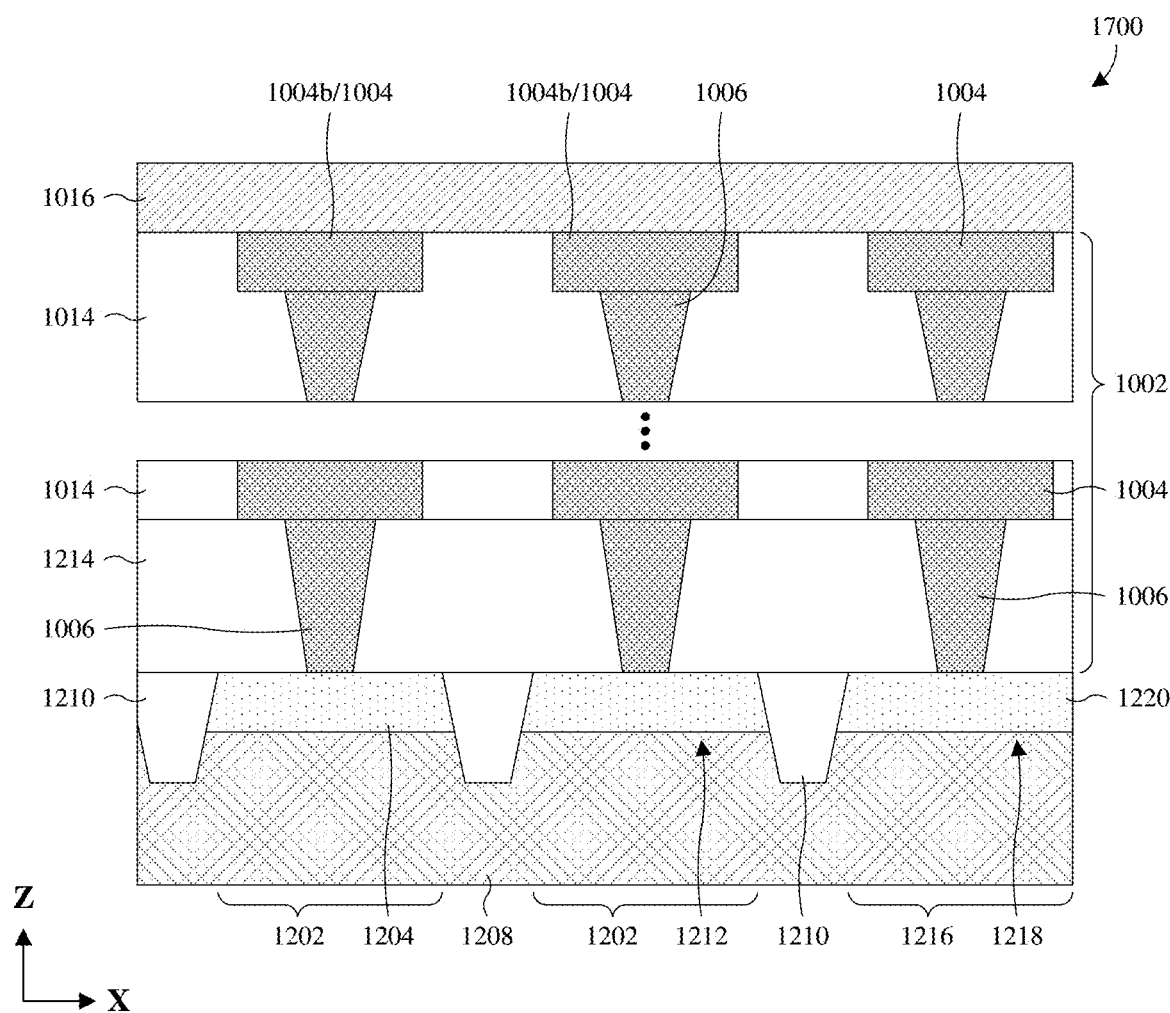

As illustrated by the cross-sectional view 1700 of FIG. 17, an interconnect structure 1002 is partially formed over and electrically coupled to the semiconductor devices (e.g., the access transistors 1212 and the peripheral device 1218). The interconnect structure 1002 comprises a plurality of wires 1004 and a plurality of vias 1006 stacked in a dielectric structure. The dielectric structure comprises an ILD layer 1214 and a plurality of IMD layers 1014 over the ILD layer 1214. The plurality of wires 1004 comprises a plurality of bottom electrode wires 1004b along a top surface of the interconnect structure 1002. The bottom electrode wires 1004b are individual to and respectively at the 1T1R cells 1202 being formed. Further, the bottom electrode wires 1004b are respectively electrically coupled to the drain regions 1204 of the access transistors 1212 by the wires 1004 and the vias 1006.

Also illustrated by the cross-sectional view 1700 of FIG. 17, a via dielectric layer 1016 is deposited on the interconnect structure 1002.

Figure 18:
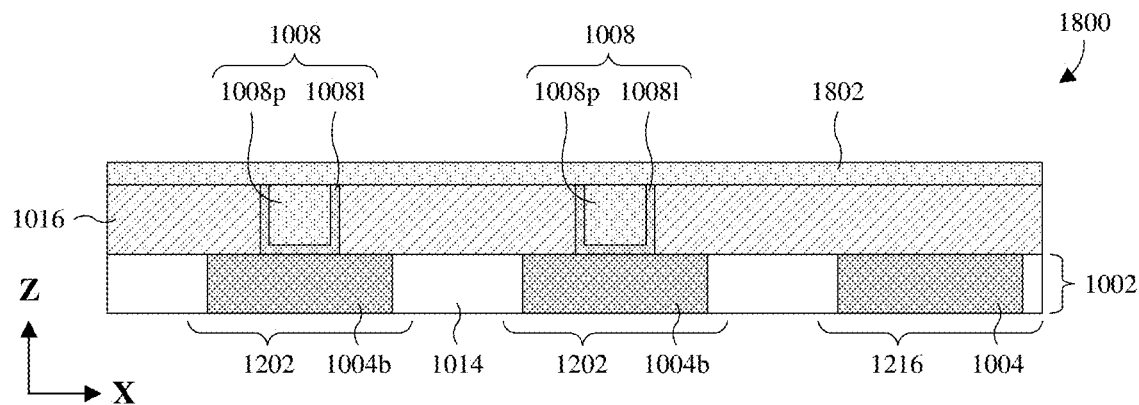

As illustrated by the cross-sectional view 1800 of FIG. 18, bottom electrode vias 1008 are formed in the via dielectric layer 1016. Note that for drawing compactness, a lower portion of the interconnect structure 1002 and structure underlying the lower portion are omitted herein and in subsequent figures. The bottom electrode vias 1008 are individual to the 1T1R cells 1202 being formed and extend through the via dielectric layer 1016 respectively to the bottom electrode wires 1004b. Further, the bottom electrode vias 1008 comprise individual via plugs 1008p and individual via liners 1008l. In alternative embodiments, the via liners 1008l are omitted. The via liners 1008l cup undersides of the via plugs 1008p to separate the via plugs 1008p from the bottom electrode wires 1004b.

A process for forming the bottom electrode vias 1008 may, for example, comprise: 1) patterning the via dielectric layer 1016 to form openings individual to and respectively exposing the bottom electrode wires 1004b; 2) depositing a liner layer and a plug layer filling the openings and covering the via dielectric layer 1016; and 3) performing a planarization into the plug and liner layers to uncover the via dielectric layer 1016. Other suitable processes are, however, amenable.

Also illustrated by the cross-sectional view 1800 of FIG. 18, a bottom electrode layer 1802 is deposited covering the via dielectric layer 1016 and the bottom electrode vias 1008. The bottom electrode layer 1802 is conductive and is electrically coupled to the bottom electrode wires 1004b through the bottom electrode vias 1008. The bottom electrode layer 1802 may, for example, be or comprise a metal, a metal nitride, a metal oxide, doped polysilicon, some other suitable conductive material(s), or any combination of the foregoing. Further, the bottom electrode layer 1802 may, for example, be or comprise aluminum, titanium, tantalum, gold, platinum, tungsten, nickel, iridium, titanium nitride, tantalum nitride, N-doped polysilicon, P-doped polysilicon, some other suitable material(s), or any combination of the foregoing. In some embodiments, the bottom electrode layer 1802 is the same material as the via plugs 1008p.

While the bottom electrode layer 1802 and the bottom electrode vias 1008 are described as being separately formed, the bottom electrode layer 1802 and the bottom electrode vias 1008 may be formed together in alternative embodiments. In at least some of these alternative embodiments, the via plugs 1008p are part of the bottom electrode layer 1802 and there is no boundary between the via plugs 1008p and the bottom electrode layer 1802.

Figure 19:
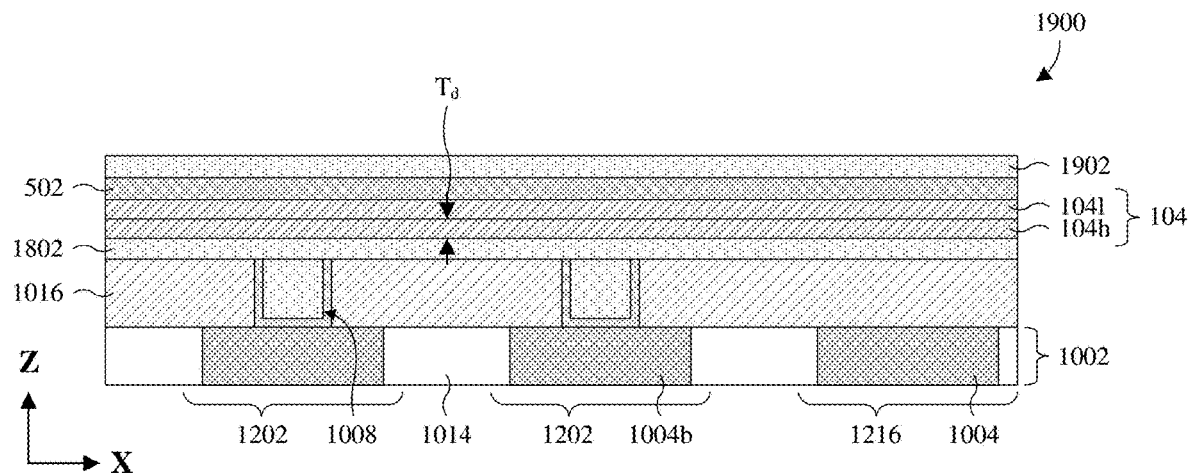

As illustrated by the cross-sectional view 1900 of FIG. 19, multiple dielectric layers 104 are deposited vertically stacked over the bottom electrode layer 1802. Further, a dielectric layer 104h having a highest electron affinity amongst the multiple dielectric layers 104 (i.e., a HEA dielectric layer 104h) is deposited first and is hence closest to the bottom electrode layer 1802. As will be seen hereafter, the multiple dielectric layers 104 are divided into segments that are individual to the memory cells being formed and that serve as switching layers for the memory cells. Further, it has been appreciated that by arranging the HEA dielectric layer 104h closest to the bottom electrode layer 1802, the likelihood of the memory cells becoming stuck during cycling is reduced at least when the memory cells are RRAM cells.

The multiple dielectric layers 104 include the HEA dielectric layer 104h and further include a dielectric layer 104l having a low electron affinity (i.e., a LEA dielectric layer 104l) compared to the HEA dielectric layer 104h. The LEA dielectric layer 104l overlies the HEA dielectric layer 104h and is hence farther from the bottom electrode layer 1802 than the HEA dielectric layer 104h. In alternative embodiments, the multiple dielectric layers 104 include two or more LEA dielectric layers vertically stacked over the HEA dielectric layer 104h and each as the LEA dielectric layer 104l is described.

The HEA dielectric layer 104h is a different dielectric material than the LEA dielectric layer 104l. Each of the HEA and LEA dielectric layers 104h, 104l may, for example, be a metal oxide, a metal oxynitride, a component metal oxide, some other suitable dielectric(s), or any combination of the foregoing. Further, each of the HEA and LEA dielectric layers 104h, 104l may, for example, be titanium oxide (e.g., $TiO_2$), hafnium oxide (e.g., $HfO_2$), hafnium aluminum oxide (e.g., $Hf_xAl_{1-x}O_2$), tantalum oxide (e.g., $Ta_2O_5$), hafnium tantalum oxide (e.g., $Hf_xTa_{1-x}O_2$), tungsten oxide (e.g., $WO_2$), zirconium oxide (e.g., $ZrO_2$), aluminum oxide (e.g., $Al_2O_3$), sulfated tin oxide (e.g., STO), some other suitable dielectric(s), or any combination of the foregoing. In some embodiments, the HEA dielectric layer 104h is a high k dielectric and/or the LEA dielectric layer 104l is a high k dielectric.

The HEA and LEA dielectric layers 104h, 104l have different material systems or different material compositions. Different material systems correspond to different sets of elements. For example, the HEA dielectric layer 104h may be tantalum oxide (e.g., $Ta_2O_5$), whereas the LEA dielectric layer 104l may be aluminum oxide (e.g., $Al_2O_3$). Different material compositions correspond to different ratios of elements for the same set of elements (e.g., the same material systems). For example, the HEA dielectric layer 104h may be aluminum oxide (e.g., $Al_2O_3$) and the LEA dielectric layer 104l may be aluminum oxide with a different ratio of aluminum and oxide (e.g., $Al_xO_y$, where $x \neq 2$ and $y \neq 3$). While the preceding two examples provide specific materials, other suitable materials are, however, amenable.

The HEA and LEA dielectric layers 104h, 104l have individual thicknesses $T_d$. In some embodiments, the thicknesses $T_d$ are about 1-50 nanometers, about 1-25 nanometers, about 25-50 nanometers, or some other suitable value. If the thickness $T_d$ of the HEA or LEA dielectric layer 104h, 104l is too small (e.g., less than about 1 nanometer or some other suitable value), benefits from material properties of the dielectric layer may not be attained. For example, if the thickness $T_d$ of the HEA dielectric layer 104h is too small, the HEA dielectric layer 104h may not prevent memory cells being formed from becoming stuck during cycling at least when the memory cells are RRAM cells. If the thickness $T_d$ of the HEA or LEA dielectric layer 104h, 104l is too large (e.g., more than about 50 nanometers or some other suitable value), operating voltages of the memory cells being formed may be too high. The high voltages may, for example, increase power consumption, reduce the lifespan of the memory cell, and increase the risk of device failure.

A process for depositing the multiple dielectric layers 104 may, for example, comprise sequentially depositing the multiple dielectric layers 104 by chemical vapor deposition (CVD), physical vapor deposition (PVD), some other suitable deposition process(es), or any combination of the foregoing. In some embodiments, the HEA dielectric layer 104h is deposited by thermal oxidation of the bottom electrode layer 1802 and then the LEA dielectric layer 104l is deposited by CVD, PVD, or some other suitable deposition process.

As noted above, the HEA and LEA dielectric layers 104h, 104l have different material systems or different material compositions. In some embodiments in which the HEA and LEA dielectric layers 104h, 104l have different material systems, the HEA and LEA dielectric layers 104h, 104l are deposited by vapor deposition respectively using different sets of precursors. In some embodiments in which the HEA and LEA dielectric layers 104h, 104l have different material compositions, the HEA and LEA dielectric layers 104h, 104l are deposited by vapor deposition using the same set of precursors but different ratios of the precursors. Further, in some embodiments in which the HEA and LEA dielectric layers 104h, 104l have different material compositions, the HEA and LEA dielectric layers 104h, 104l are deposited in situ within a common process chamber.

Also illustrated by the cross-sectional view 1900 of FIG. 19, a cap layer 502 and a top electrode layer 1902 are deposited vertically stacked over the multiple dielectric layers 104. In alternative embodiments, the cap layer 502 is omitted and is hence not deposited.

The cap layer 502 has a high affinity for oxygen compared to the bottom and top electrode layers 1802, 1902. In other words, the cap layer 502 depends upon less energy to react with oxygen than the bottom and top electrode layers 1802, 1902. At least when the memory cells being formed are metal-ion type RRAM cells and oxygen-ion type RRAM cells, the cap layer 502 may enhance performance of the memory cells. For example, the cap layer 502 may increase the switching windows and/or reduce operating voltages. The cap layer 502 may, for example, be or comprise aluminum, titanium, tantalum, hafnium, titanium oxide, hafnium oxide, zirconium oxide, germanium oxide, cerium oxide, some other suitable material(s), or any combination of the foregoing. In some embodiments, the cap layer 502 is conductive and/or is metal. For example, in embodiments in which the memory cells being formed are a metal-ion type RRAM cells, the cap layer 502 is metal. In alternative embodiments, the cap layer 502 is dielectric. In embodiments in which the cap layer 502 is dielectric, the cap layer 502 has a lower electron affinity than the HEA dielectric layer 104h.

The top electrode layer 1902 may, for example, be or comprise a metal, a metal nitride, doped polysilicon, some other suitable conductive material(s), or any combination of the foregoing. Further, the top electrode layer 1902 may, for example, be or comprise aluminum, titanium, tantalum, gold, platinum, tungsten, nickel, iridium, titanium nitride, tantalum nitride, N-doped polysilicon, P-doped polysilicon, some other suitable material(s), or any combination of the foregoing.

Figure 20:
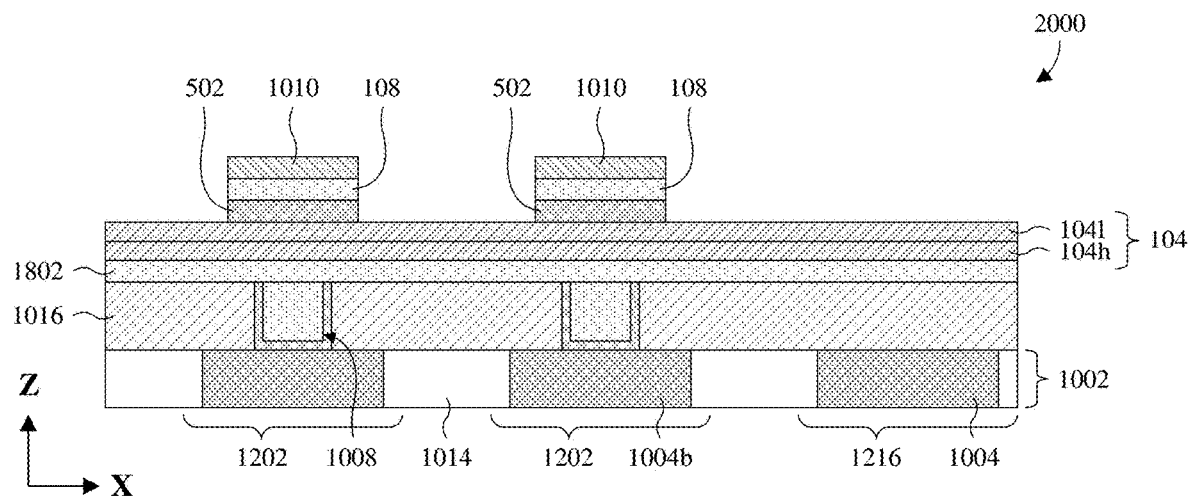

As illustrated by the cross-sectional view 2000 of FIG. 20, hard masks 1010 are formed individual to and respectively at the 1T1R cells 1202 being formed. As seen hereafter, the hard masks 1010 have patterns for memory cells of the 1T1R cells 1202. The hard masks 1010 may, for example, be formed by depositing a hard mask layer over the top electrode layer 1902 (see, e.g., FIG. 19) and subsequently patterning the hard mask layer into the hard masks 1010. The patterning may, for example, be performed by a photolithography/etching process or some other suitable patterning process.

Also illustrated by the cross-sectional view 2000 of FIG. 20, a first etch is performed into the top electrode layer 1902 (see, e.g., FIG. 19) and the cap layer 502 (see, e.g., FIG. 19) with the hard masks 1010 in place. The first etch stops on the multiple dielectric layers 104 and transfers patterns of the hard masks 1010 to the top electrode layer 1902 and the cap layer 502. By transferring the patterns to the top electrode layer 1902, the first etch divides the top electrode layer 1902 into top electrodes 108 individual to the memory cells being formed. By transferring the patterns to the cap layer 502, the first etch divides the cap layer 502 into cap segments individual to the memory cells.

Figure 21:
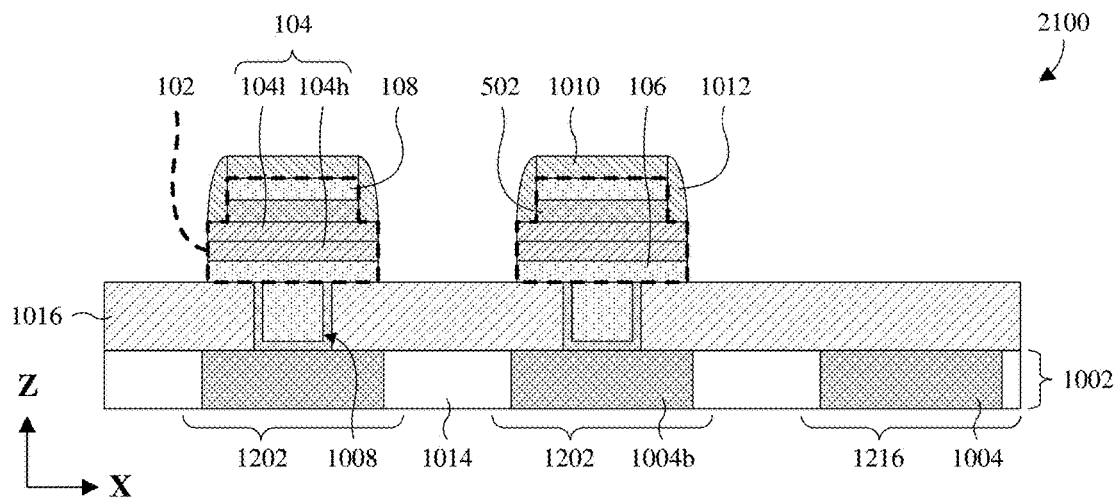

As illustrated by the cross-sectional view 2100 of FIG. 21, sidewall spacer structures 1012 are formed on common sidewalls defined by the hard masks 1010, the top electrodes 108, and the cap layer 502. The sidewall spacer structures 1012 may, for example, be or comprise silicon nitride and/or some other suitable dielectric(s). A process for forming the sidewall spacer structures 1012 may, for example, comprise: 1) a depositing a spacer layer covering and conformably lining the structure of FIG. 20; and 2) etching back the spacer layer. Other suitable processes are, however, amenable.

Also illustrated by the cross-sectional view 2100 of FIG. 21, a second etch is performed into the multiple dielectric layers 104 and the bottom electrode layer 1802 with the hard masks 1010 and the sidewall spacer structures 1012 in place. The second etch stops on the via dielectric layer 1016 and transfers patterns collectively defined by the hard masks 1010 and the sidewall spacer structures 1012 to the dielectric layers 104 and the bottom electrode layer 1802. By transferring the patterns to the multiple dielectric layers 104, the second etch divides the multiple dielectric layers 104 into dielectric segments individual to the memory cells being formed. By transferring the patterns to the bottom electrode layer 1802, the second etch divides the bottom electrode layer 1802 into bottom electrodes 106 individual to the memory cells.

Upon completion of the second etch, memory cells 102 individual to the 1T1R cells 1202 being formed remain. Individual bottom electrodes 106 of the memory cells 102 respectively overlie and electrically couple to the bottom electrode vias 1008. Individual dielectric segments of the multiple dielectric layers 104 respectively overlie the bottom electrodes 106. Individual cap segments of the cap layer 502 respectively overlie the dielectric segments. Individual top electrodes 108 respectively overlying the cap segments. The memory cells 102 may, for example, be oxygen-ion type RRAM cells, metal-ion type RRAM cells, or some other suitable type of memory cells.

During operation of the memory cells 102, the individual dielectric segments serve as switching layers that change between HRSs and LRSs. Further, because the HEA dielectric layer 104h is closest to the bottom electrodes 106 amongst the multiple dielectric layers 104, the likelihood of the memory cells 102 becoming stuck during cycling is reduced at least when the memory cells are RRAM cells. Hence, the likelihood of hard reset/failure bits is reduced. Because the likelihood of hard reset/failure bits is reduced, ECC capacity for a memory array (not shown) incorporating the memory cells 102 is less likely to be used by hard reset/failure bits. Hence, the likelihood of the memory array failing is less likely. Because the likelihood of the memory array failing is reduced by the HEA dielectric layer 104h, no additional ECC capacity and therefore no additional IC chip area are needed.

Because the likelihood of the memory cells 102 becoming stuck during cycling is reduced by the HEA dielectric layer 104h, the likelihood may be reduced by an additional deposition process during the method. As such, the HEA dielectric layer 104h adds little to no extra cost and is compatible with 40 nanometer process nodes and smaller.

Figure 22:
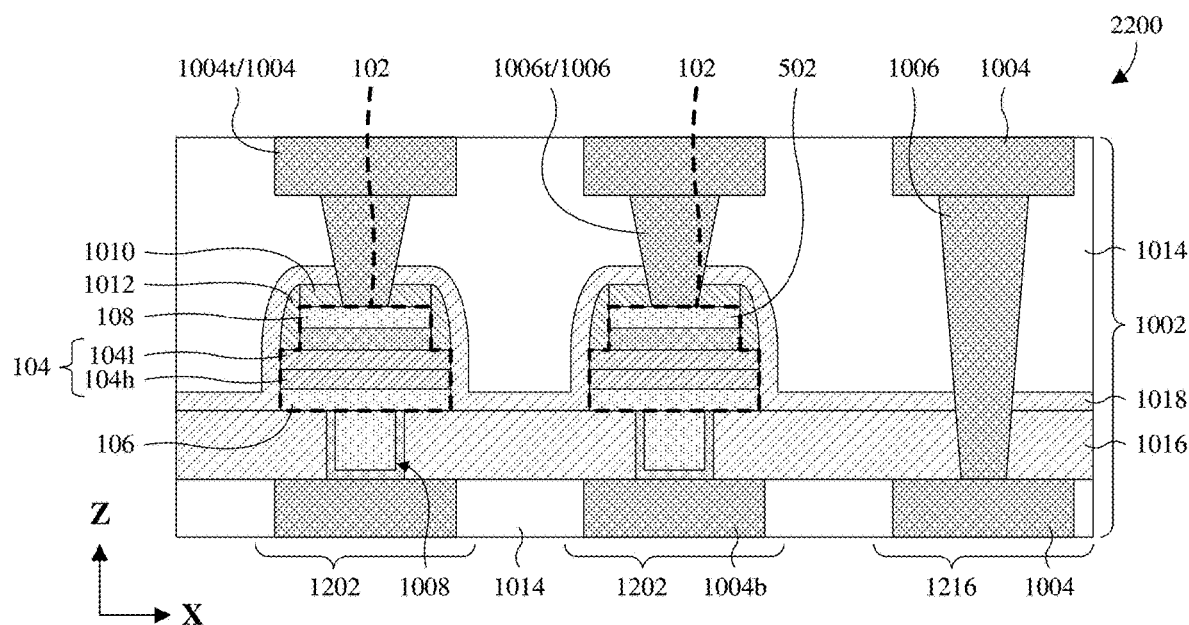

As illustrated by the cross-sectional view 2200 of FIG. 22, the interconnect structure 1002 is completed around the memory cells 102. This includes depositing an etch stop layer 1018 and an additional IMD layer 1014 covering the memory cells 102, and subsequently forming a plurality of additional wires 1004 and a plurality of additional vias 1006 in the etch stop layer 1018 and the additional IMD layer 1014. The plurality of additional wires 1004 comprises top electrode wires 1004t respectively overlying the memory cells 102, and the plurality of additional vias 1006 comprises top electrode vias 1006t extending from the top electrode wires 1004t respectively to the top electrodes 108 of the memory cells 102.

Figure 23:
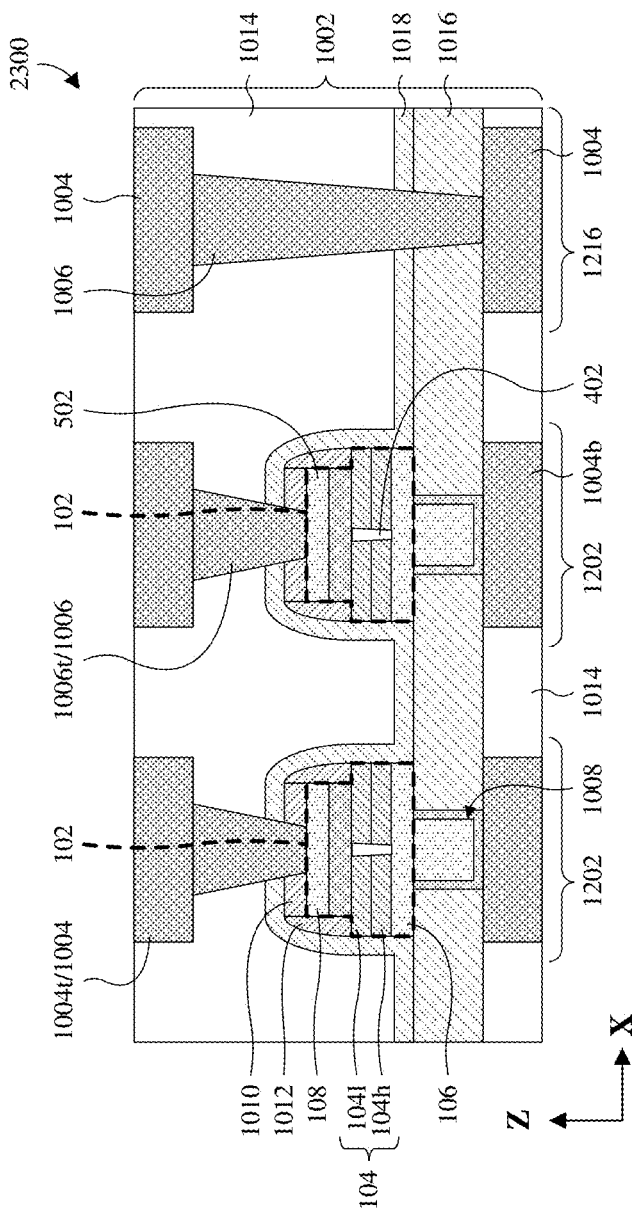

As illustrated by the cross-sectional view 2300 of FIG. 23, conductive filaments 402 individual to the memory cells 102 are formed in the multiple dielectric layers 104 respectively at the memory cells 102. The forming may, for example, comprise applying a forming voltage across each of the memory cells 102. For example, the bottom electrodes 106 of the memory cells 102 may be grounded while the top electrodes 108 of the memory cells 102 are biased. Other processes for forming the conductive filaments 402 are, however, amenable.

While FIGS. 16-23 are described with reference to a method, it will be appreciated that the structures shown in FIGS. 16-23 are not limited to the method but rather may stand alone separate of the method. While FIGS. 16-23 are described as a series of acts, it will be appreciated that the order of the acts may be altered in other embodiments. While FIGS. 16-23 illustrate and describe as a specific set of acts, some acts that are illustrated and/or described may be omitted in other embodiments. Further, acts that are not illustrated and/or described may be included in other embodiments.

Figure 24:
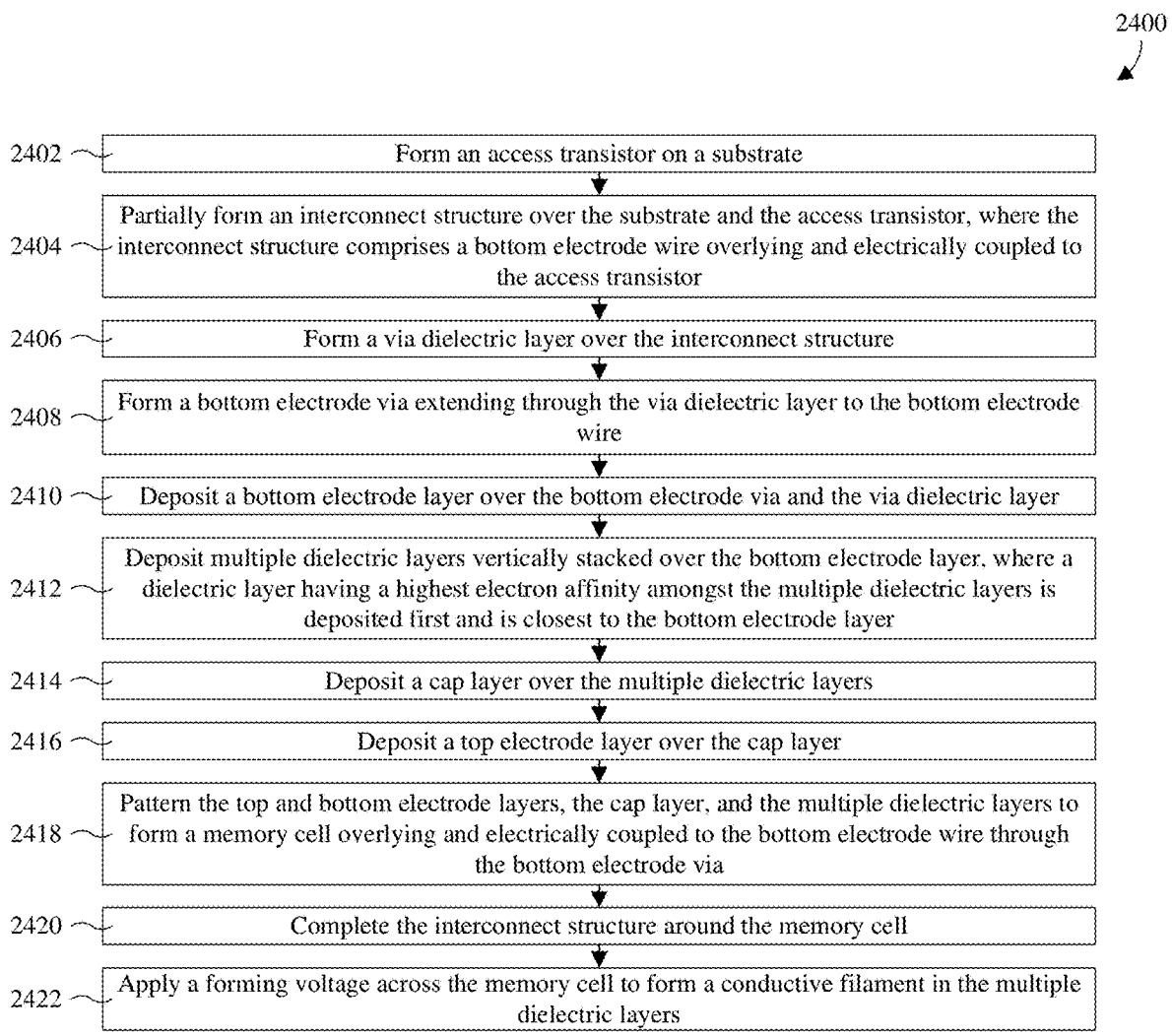
FIG. 24 illustrates a block diagram of some embodiments of the method of FIGS. 16-23.

With reference to FIG. 24, a block diagram 2400 of some embodiments of the method of FIGS. 16-23 is provided.

At 2402, an access transistor is formed on a substrate. See, for example, FIG. 16.

At 2404, an interconnect structure is partially formed over the substrate and the access transistor, where the interconnect structure comprises a bottom electrode wire overlying and electrically coupled to the access transistor. See, for example, FIG. 17

At 2406, a via dielectric layer is formed over the interconnect structure. See, for example, FIG. 17.

At 2408, a bottom electrode via is formed extending through the via dielectric layer to the bottom electrode wire. See, for example, FIG. 18.

At 2410, a bottom electrode layer is deposited over the via dielectric layer and the bottom electrode via. See, for example, FIG. 18.

At 2412, multiple dielectric layers are deposited vertically stacked over the bottom electrode layer, where a dielectric layer having a highest electron affinity amongst the multiple dielectric layers is deposited first and is closest to the bottom electrode layer. See, for example, FIG. 19.

At 2414, a cap layer is deposited over the multiple dielectric layers. See, for example, FIG. 19.

At 2416, a top electrode layer is deposited over the cap layer. See, for example, FIG. 19.

At 2418, the top and bottom electrode layers, the cap layer, and the multiple dielectric layers are patterned to form a memory cell overlying and electrically coupled to the bottom electrode wire through the bottom electrode via. See, for example, FIGS. 20 and 21.

At 2420, the interconnect structure is completed around the memory cell. See, for example, FIG. 22.

At 2422, a forming voltage is applied across the memory cell to form a conductive filament in the multiple dielectric layers. See, for example, FIG. 23.

While the block diagram 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 25-29 a series of cross-sectional views 2500-2900 of some alternative embodiments of the method of FIGS. 16-23 is provided in which layers from which the memory cells are formed are patterned using a planarization. The cross-sectional views 2500-2900 may, for example, be taken along line C in FIG. 13 or at some other suitable location in FIG. 13. Further, the cross-sectional views 2500-2900 may, for example, illustrate formation of the memory cell 102 of FIG. 11B with the addition of a cap layer.

Figure 25:
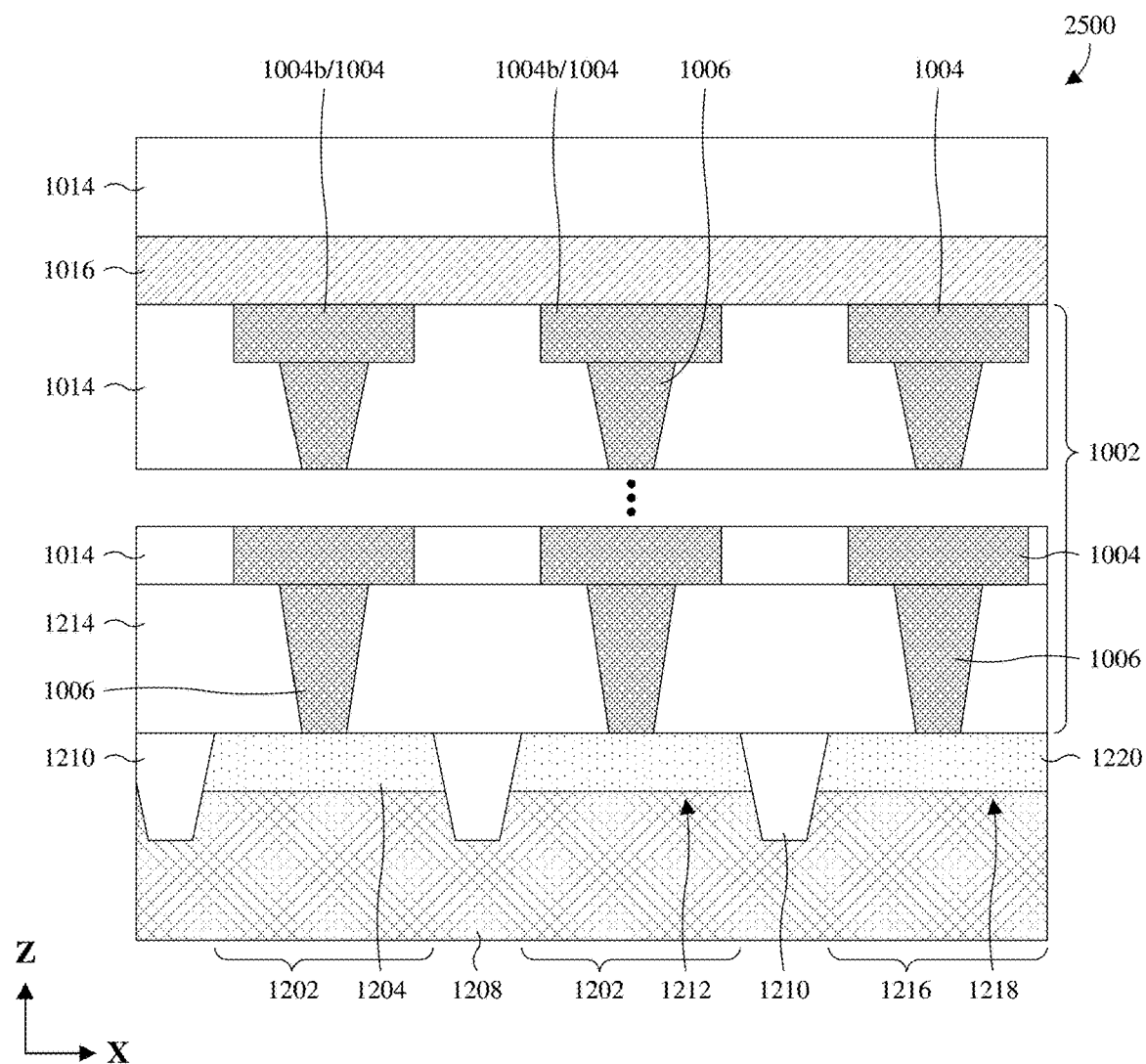
FIGS. 25-29 illustrate a series of cross-sectional views of some alternative embodiments of the method of FIGS. 16-23 in which layers from which the memory cells are formed are patterned using a planarization.

As illustrated by the cross-sectional view 2500 of FIG. 25, the acts at FIGS. 16 and 17 are performed. A trench isolation structure 1210 is formed extending into a top of a substrate 1208 as illustrated and described with regard to FIG. 16. Further, a plurality of semiconductor devices is formed on the substrate 1208 as illustrated and described with regard to FIG. 16. The plurality of semiconductor devices comprises access transistors 1212 (only partially shown) and a peripheral device 1218 (only partially shown). An interconnect structure 1002 is partially formed over and electrically coupled to the semiconductor devices as illustrated and described with regard to FIG. 17. Further, a via dielectric layer 1016 is deposited on the interconnect structure 1002 as illustrated and described with regard to FIG. 17.

Also illustrated by the cross-sectional view 2500 of FIG. 25, an additional IMD layer 1014 is deposited covering the via dielectric layer 1016.

Figure 26:
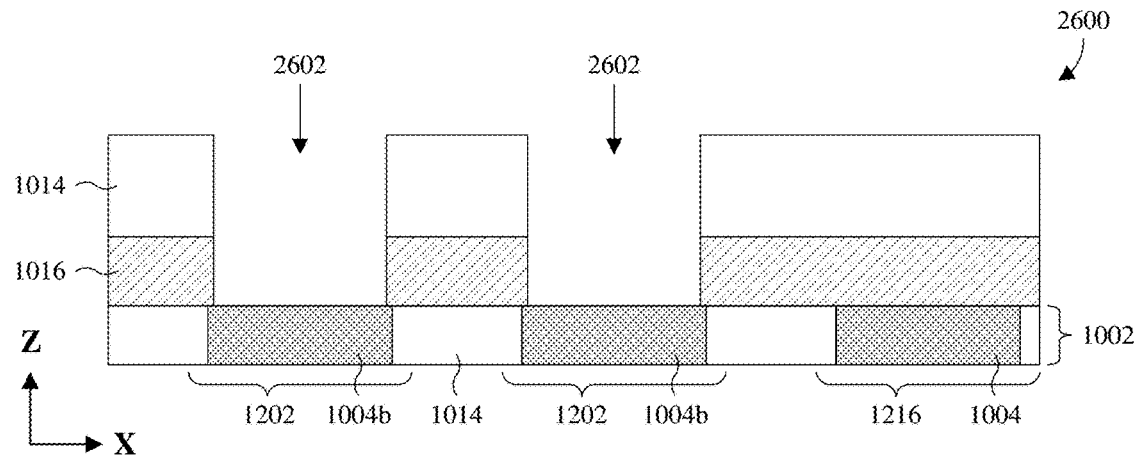

As illustrated by the cross-sectional view 2600 of FIG. 26, the via dielectric layer 1016 and the additional IMD layer 1014 atop the via dielectric layer 1016 are patterned to form memory cell openings 2602 individual to and respectively at the 1T1R cells 1202 being formed. Note that for drawing compactness, a lower portion of the interconnect structure 1002 and structure underlying the lower portion are omitted herein and in subsequent figures. The patterning may, for example, be performed by a photolithography/etching process or some other suitable patterning process.

Figure 27:
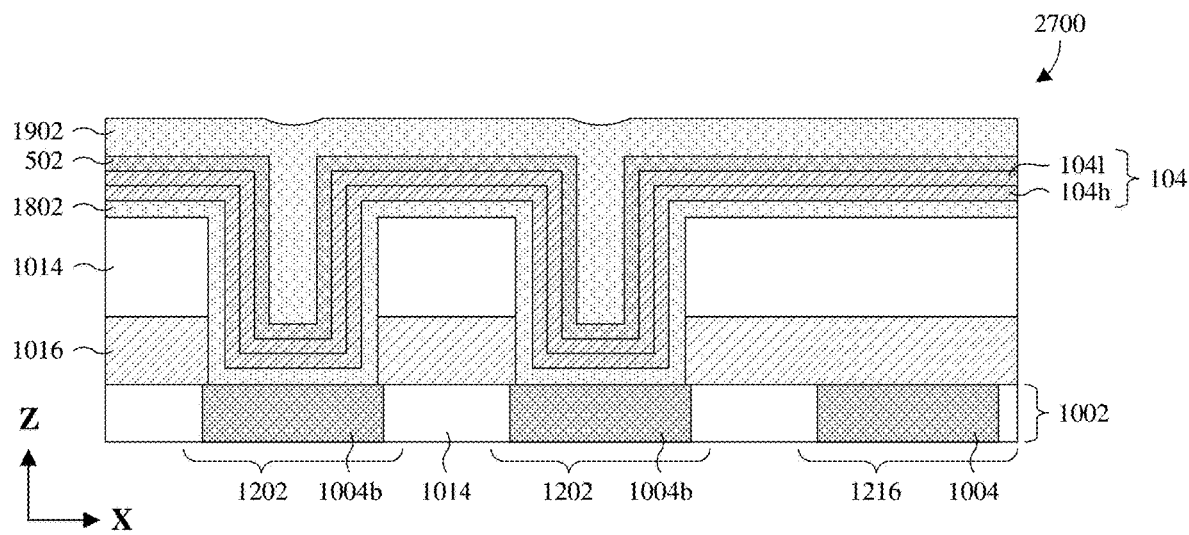

As illustrated by the cross-sectional view 2700 of FIG. 27, a bottom electrode layer 1802, multiple dielectric layers 104, a cap layer 502, and a top electrode layer 1902 are deposited lining and filling the memory cell openings 2602 (see, e.g., FIG. 26). In alternative embodiments, the cap layer 502 is omitted and is hence not formed. In alternative embodiments, the multiple dielectric layers 104 include three or more dielectric layers. The bottom electrode layer 1802, the multiple dielectric layers 104, the cap layer 502, and the top electrode layer 1902 are as described with regard to FIGS. 18 and 19. Hence, a dielectric layer 104$h$ having a highest electron affinity amongst the multiple dielectric layers 104 (i.e., a HEA dielectric layer 104$h$) is deposited first and is hence closest to the bottom electrode layer 1802. It has been appreciated that by arranging the HEA dielectric layer 104$h$ closest to the bottom electrode layer 1802, the likelihood of memory cells becoming stuck during cycling is reduced. The bottom electrode layer 1802, the multiple dielectric layers 104, the cap layer 502, and the top electrode layer 1902 are formed as described with regard to FIGS. 18 and 19.

Figure 28:
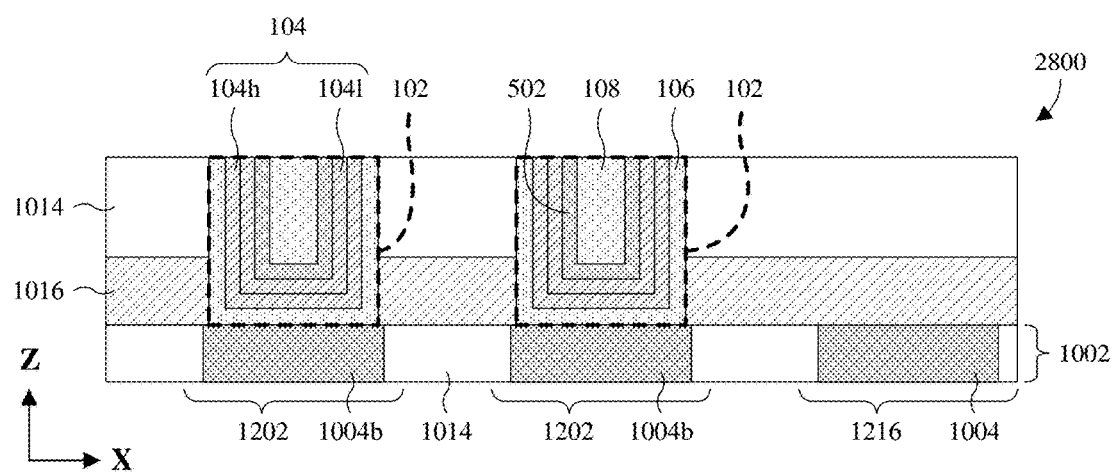

As illustrated by the cross-sectional view 2800 of FIG. 28, a planarization is performed into the bottom electrode layer 1802 (see, e.g., FIG. 27), the multiple dielectric layers 104, the cap layer 502, and the top electrode layer 1902 (see, e.g., FIG. 27). The planarization stops on the additional IMD layer 1014 atop the via dielectric layer 1016 and transfers a pattern of the memory cell openings 2602 (see, e.g., FIG. 26) to the bottom electrode layer 1802, the multiple dielectric layers 104, the cap layer 502, and the top electrode layer 1902.

By transferring the pattern, the planarization form memory cells 102 individual to and respectively at the 1T1R cells 1202. Transferring the pattern to the bottom and top electrode layers 1802, 1902 divides the bottom and top electrode layers 1802, 1902 respectively into bottom electrodes 106 individual to the memory cells 102 and top electrodes 108 individual to the memory cells 102. Transferring the pattern to the multiple dielectric layers 104 divides the multiple dielectric layers 104 into dielectric segments individual to the memory cells 102. Transferring the pattern to the cap layer 502 divides the cap layer 502 into cap segments individual to the memory cells 102. Upon completion of the patterning, the bottom electrodes 106, the dielectric segments, and the cap segments have U-shaped profiles. V-shaped and other suitable profiles are, however, amenable.

Because the planarization transfers a pattern from the patterning at FIG. 26 to the various layers of the memory cells 102, the memory cells 102 may be formed by a single photolithography/etching process. This is in contrast to the multiple photolithography/etching processes (e.g., respectively at FIGS. 18 and 20) that may be used to form the memory cells 102 at FIGS. 16-23. Because photolithography is expensive, reducing the number of photolithography/etching processes may significantly reduce costs.

Figure 29:
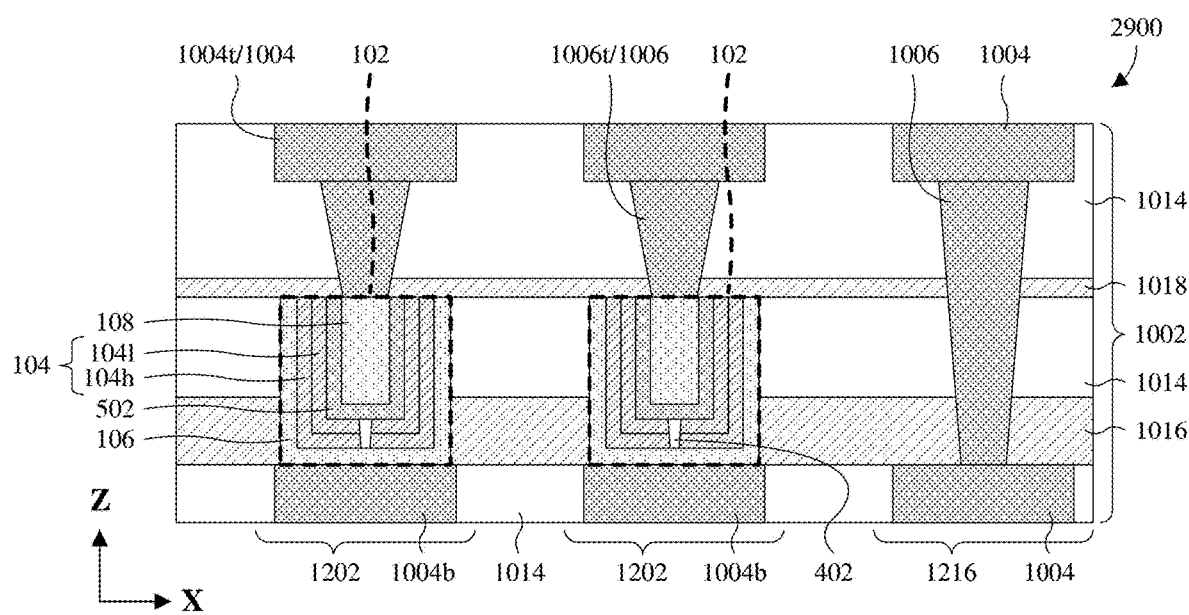

As illustrated by the cross-sectional view 2900 of FIG. 29, the acts at FIGS. 22 and 23 are performed. The interconnect structure 1002 is completed around the memory cells 102 as illustrated and described with regard to FIG. 22. Conductive filaments 402 individual to the memory cells 102 are formed in the multiple dielectric layers 104 respectively at the memory cells 102 as illustrated and described with regard to FIG. 23.

While FIGS. 25-29 are described with reference to a method, it will be appreciated that the structures shown in FIGS. 25-29 are not limited to the method but rather may stand alone separate of the method. While FIGS. 25-29 are described as a series of acts, it will be appreciated that the order of the acts may be altered in other embodiments. While FIGS. 25-29 illustrate and describe as a specific set of acts, some acts that are illustrated and/or described may be omitted in other embodiments. Further, acts that are not illustrated and/or described may be included in other embodiments.

Figure 30:
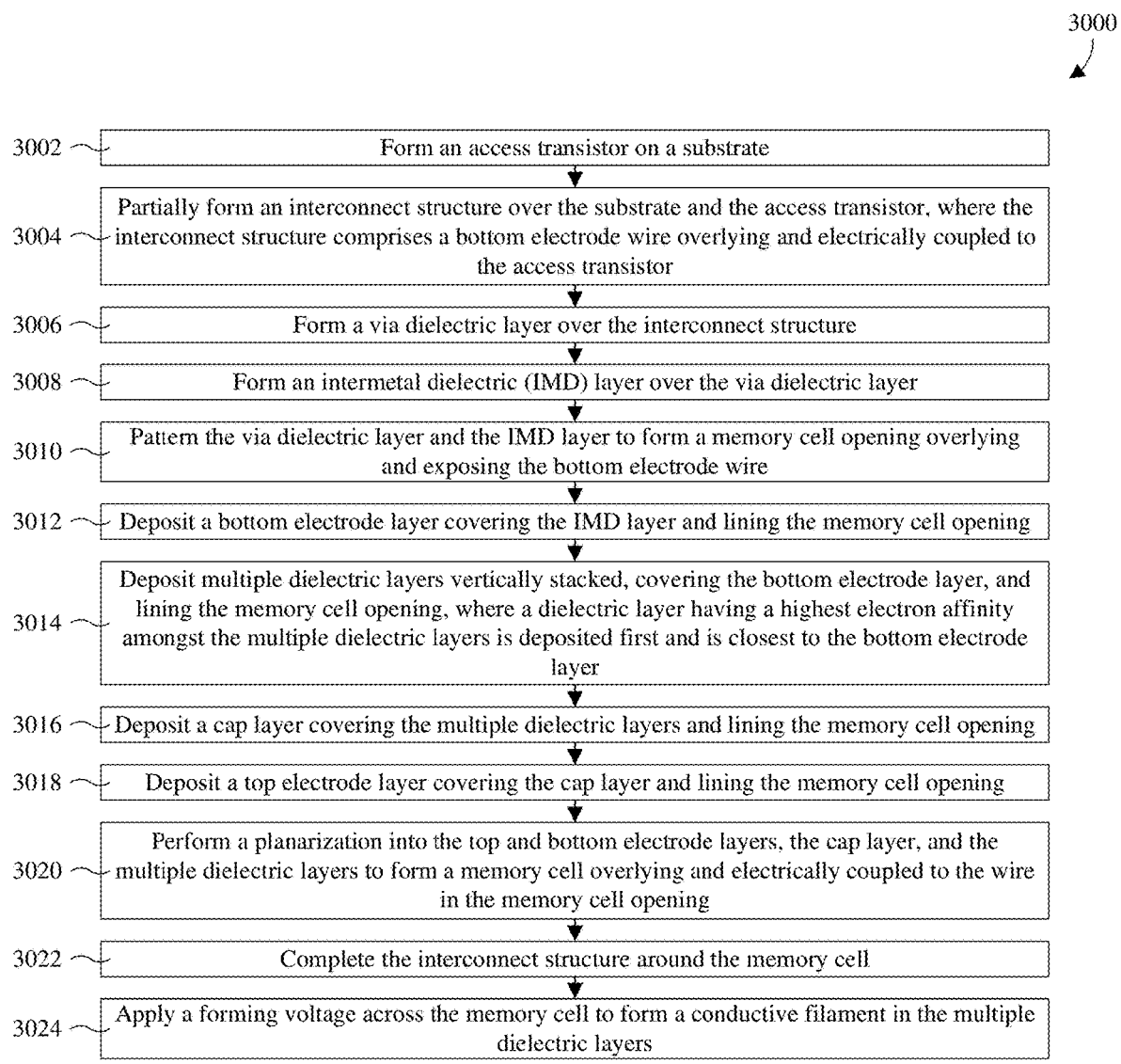
FIG. 30 illustrates a block diagram of some embodiments of the method of FIGS. 25-29.

With reference to FIG. 30, a block diagram 3000 of some embodiments of the method of FIGS. 25-29 is provided.

At 3002, an access transistor is formed on a substrate. See, for example, FIGS. 16 and 25.

At 3004, an interconnect structure is partially formed over the substrate and the access transistor, where the interconnect structure comprises a bottom electrode wire overlying and electrically coupled to the access transistor. See, for example, FIGS. 17 and 25.

At 3006, a via dielectric layer is formed over the interconnect structure. See, for example, FIGS. 17 and 25.

At 3008, an IMD layer is formed over the via dielectric layer. See, for example, FIG. 25.

At 3010, the via dielectric layer and the IMD layer are patterned to form a memory cell opening overlying and exposing the bottom electrode wire. See, for example, FIG. 26.

At 3012, a bottom electrode layer is deposited covering the IMD layer and lining the memory cell opening. See, for example, FIG. 27.

At 3014, multiple dielectric layers are deposited vertically stacked, covering the bottom electrode layer, and lining the memory cell opening, where a dielectric layer having a highest electron affinity amongst the multiple dielectric layers is deposited first and is closest to the bottom electrode layer. See, for example, FIG. 27.

At 3016, a cap layer is deposited covering the multiple dielectric layers and lining the memory cell opening. See, for example, FIG. 27.

At 3018, a top electrode layer is deposited covering the cap layer and lining the memory cell opening. See, for example, FIG. 27.

At 3020, a planarization is performed into the top and bottom electrode layers, the cap layer, and the multiple dielectric layers to form a memory cell overlying and electrically coupled to the wire in the memory cell opening. See, for example, FIG. 28.

At 3022, the interconnect structure is completed around the memory cell. See, for example, FIG. 29.

At 3024, a forming voltage is applied across the memory cell to form a conductive filament in the multiple dielectric layers. See, for example, FIG. 29.

While the block diagram 3000 of FIG. 30 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a memory cell including: a bottom electrode; a top electrode overlying the bottom electrode; and a dielectric stack including a plurality of dielectric layers stacked between the bottom and top electrodes; wherein the plurality of dielectric layers includes a first dielectric layer, and the first dielectric layer is a closest one of the dielectric layers to the bottom electrode and has a highest electron affinity amongst the dielectric layers. In some embodiments, the plurality of dielectric layers includes a second dielectric layer overlying the first dielectric layer, wherein the second dielectric layer has a different set of elements than the first dielectric layer. In some embodiments, the plurality of dielectric layers includes a second dielectric layer overlying the first dielectric layer, wherein the second dielectric layer has a same set of elements as the first dielectric layer and further has a different ratio of the elements as the first dielectric layer. In some embodiments, the dielectric stack consists of two dielectric layers. In some embodiments, the memory cell further includes a cap layer overlying the dielectric stack, between the dielectric stack and the top electrode, wherein the cap layer has a higher affinity for oxygen than the top and bottom electrodes. In some embodiments, the plurality of dielectric layers includes a second dielectric layer and a third dielectric layer, wherein the second dielectric layer is between the first and third dielectric layers and has an electron affinity between that of the first dielectric layer and that of the third dielectric layer. In some embodiments, the plurality of dielectric layers includes a second dielectric layer and a third dielectric layer, wherein the second dielectric layer is between the first and third dielectric layers, and wherein the third dielectric layer has an electron affinity between that of the first dielectric layer and that of the second dielectric layer. In some embodiments, the memory cell further includes a conductive filament in the dielectric stack, wherein the conductive filament includes oxygen vacancies. In some embodiments, the memory cell further includes a conductive filament in the dielectric stack, wherein the conductive filament includes metal.

In some embodiments, the present disclosure provides a memory device including a memory cell, wherein the memory cell includes: a bottom electrode; a dielectric structure overlying the bottom electrode and including multiple different dielectric materials from top to bottom; and a top electrode overlying the dielectric structure; wherein the multiple different dielectric materials include a first dielectric material at the bottom electrode, and the first dielectric material has a bottom conductive band edge that is lowest amongst the multiple different dielectric materials. In some embodiments, a bottom conductive band edge of the dielectric structure steps up from the bottom electrode to a top surface of the dielectric structure. In some embodiments, a bottom conductive band edge of the dielectric structure steps up from the bottom electrode to a midpoint between the bottom electrode and a top surface of the dielectric structure, and wherein the bottom conductive band edge steps down from the midpoint to the top surface. In some embodiments, the memory cell further includes: a cap layer between and directly contacting the top electrode and the dielectric structure, wherein the cap layer depends upon less energy to react with oxygen than the top electrode. In some embodiments, the memory device further includes a conductive filament in the dielectric structure, wherein the conductive filament extends from a top surface of the dielectric structure towards a bottom surface of the dielectric structure and terminates before the bottom surface.

In some embodiments, the present disclosure provides a method including: depositing a bottom electrode layer over a substrate; depositing a dielectric film over and directly on the bottom electrode layer, wherein the dielectric film includes multiple different dielectric layers that are vertically stacked, wherein the multiple different dielectric layers include a first dielectric layer at the bottom electrode layer, and wherein the first dielectric layer has a highest electron affinity amongst the multiple different dielectric layers; depositing a top electrode layer over the dielectric film; and patterning the bottom electrode layer, the dielectric film, and the top electrode layer into a memory cell. In some embodiments, the method further includes depositing a cap layer over the dielectric film, wherein the top electrode layer is deposited over the cap layer and has a lesser affinity for oxygen than the cap layer. In some embodiments, the dielectric film includes a second dielectric layer, and wherein the depositing of the dielectric film includes: depositing the first dielectric layer by vapor deposition; and depositing the second dielectric layer over the first dielectric layer by vapor deposition, wherein the depositing of the first dielectric layer and the depositing of the second dielectric layer are performed using a same set of precursors but different ratios of the precursors. In some embodiments, the dielectric film includes a second dielectric layer, and wherein the depositing of the dielectric film includes: depositing the first dielectric layer by vapor deposition with a first set of precursors; and depositing the second dielectric layer over the first dielectric layer by vapor deposition with a second set of precursors different than the first set of precursors. In some embodiments, the method further includes applying a forming voltage having a positive polarity from a top electrode of the memory cell to a bottom electrode of the memory cell to form a conductive filament in a dielectric structure separating the top and bottom electrodes. In some embodiments, an electron affinity of the dielectric film decreases discretely and uninterrupted from a bottom surface of the dielectric film to a top surface of the dielectric film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a bottom electrode layer over a substrate;
   depositing a dielectric film over and directly on the bottom electrode layer, wherein the dielectric film comprises multiple different dielectric layers that are vertically stacked, wherein the multiple different dielectric layers comprise a first dielectric layer at the bottom electrode layer, and wherein the first dielectric layer has a highest electron affinity amongst the multiple different dielectric layers;
   depositing a top electrode layer over the dielectric film; and
   patterning the bottom electrode layer, the dielectric film, and the top electrode layer into a memory cell;
   wherein the multiple different dielectric layers further comprise a second dielectric layer, wherein the first dielectric layer comprises a first chemical compound with a first number of atoms of a metal element and a second number of atoms of a non-metal element, wherein the second dielectric layer comprises a second chemical compound with a third number of atoms of the metal element and a fourth number of atoms of the non-metal element, and wherein the first and third numbers are different and the second and fourth numbers are different.

2. The method according to claim 1, further comprising:
   depositing a cap layer over the dielectric film, wherein the top electrode layer is deposited over the cap layer and has a lesser affinity for oxygen than the cap layer.

3. The method according to claim 1, wherein the depositing of the dielectric film comprises:
   depositing the first dielectric layer by vapor deposition; and
   depositing the second dielectric layer over the first dielectric layer by vapor deposition, wherein the depositing of the first dielectric layer and the depositing of the second dielectric layer are performed using a same set of precursors but different ratios of the precursors.

4. The method according to claim 1, further comprising:
   applying a forming voltage having a positive polarity from a top electrode of the memory cell to a bottom electrode of the memory cell to form a conductive filament in a dielectric structure separating the top and bottom electrodes.

5. The method according to claim 1, wherein an electron affinity of the dielectric film decreases discretely and uninterrupted from a bottom surface of the dielectric film to a top surface of the dielectric film.

6. The method according to claim 1, wherein the multiple different dielectric layers further comprise a third dielectric layer, and wherein the depositing of the dielectric film comprises:
   depositing the first dielectric layer;
   depositing the second dielectric layer over the first dielectric layer; and
   depositing the third dielectric layer over the second dielectric layer;
   wherein the third dielectric layer has an electron affinity between that of the first dielectric layer and that of the second dielectric layer.

7. A method for forming a memory cell, comprising:
   forming a bottom electrode;
   forming a dielectric stack overlying the bottom electrode and comprising a plurality of dielectric layers; and
   forming a top electrode overlying the dielectric stack;
   wherein the plurality of dielectric layers comprises a bottom dielectric layer, a top dielectric layer, and an intermediate dielectric layer between the bottom and top dielectric layers, and wherein the bottom dielectric layer of the plurality of dielectric layers is a closest one of the plurality of dielectric layers to the bottom electrode and has an electron affinity that is highest amongst the plurality of dielectric layers.

8. The method according to claim 7, wherein the bottom dielectric layer directly contacts the bottom electrode.

9. The method according to claim 8, wherein the top electrode directly contacts the top dielectric layer of the plurality of dielectric layers.

10. The method according to claim 8, further comprising:
    forming a cap layer overlying and directly contacting the top dielectric layer of the plurality of dielectric layers, wherein the cap layer has a higher affinity for oxygen than the top and bottom electrodes, and wherein the top electrode is formed overlying and directly contacting the cap layer.

11. The method according to claim 7, further comprising:
forming a conductive filament in the dielectric stack, wherein the conductive filament comprises oxygen vacancies.

12. The method according to claim 7, further comprising: forming a conductive filament in the dielectric stack, wherein the conductive filament comprises metal.

13. The method according to claim 7, wherein the top dielectric layer has an electron affinity between that of the bottom dielectric layer and that of the intermediate dielectric layer.

14. A method comprising:
depositing a bottom electrode layer over a substrate;
depositing a dielectric film over the bottom electrode layer and comprising multiple different dielectric materials from a top of the dielectric film to a bottom of the dielectric film, wherein the multiple different dielectric materials comprise a first dielectric material at the bottom electrode layer, and wherein the first dielectric material has a bottom conductive band edge that is lowest amongst the multiple different dielectric materials;
depositing a top electrode layer over the dielectric film; and
patterning the bottom electrode layer, the dielectric film, and the top electrode layer into a memory cell;
wherein a bottom conductive band edge of the dielectric film steps up from the bottom electrode layer to a midpoint between the bottom electrode layer and a top surface of the dielectric film, and wherein the bottom conductive band edge of the dielectric film steps down from the midpoint to the top surface.

15. The method according to claim 14, wherein the multiple different dielectric materials comprise a second dielectric material directly contacting the top electrode layer.

16. The method according to claim 14, wherein the multiple different dielectric materials are oxides.

17. The method according to claim 14, wherein the multiple different dielectric materials comprise silicon oxide and aluminum oxide, and wherein the first dielectric material comprises the aluminum oxide.

18. The method according to claim 1, wherein the first dielectric layer consists essentially of the metal element and the non-metal element, and wherein the second dielectric layer consists essentially of the metal element and the non-metal element.

19. The method according to claim 1, further comprising:
forming a dielectric structure covering a wire;
performing an etch into the dielectric structure to form an opening exposing the wire, wherein the bottom electrode layer, the dielectric film, and the top electrode layer are deposited overlying the dielectric structure and lining the opening, and wherein the bottom electrode layer and the dielectric film have individual U-shaped profiles in the opening; and
performing a planarization into the bottom electrode layer, the dielectric film, and the top electrode layer to expose the dielectric structure.

20. The method according to claim 7, wherein an electron affinity of the intermediate dielectric layer is between the electron affinity of the bottom dielectric layer and an electron affinity of the top dielectric layer.

* * * * *